US012802762B2

(12) United States Patent

Wang et al.

(10) Patent No.: US 12,802,762 B2

(45) Date of Patent: Nov. 17, 2026

(54) NON-VOLATILE MEMORY WITH LOCATION DEPENDENT CONTROL GATE VOLTAGE

(71) Applicant: Sandisk Technologies, Inc., Milpitas, CA (US)

(72) Inventors: Ming Wang, Shanghai (CN); Xiang Yang, Santa Clara, CA (US); Liang Li, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 72 days.

(21) Appl. No.: 18/916,496

(22) Filed: Oct. 15, 2024

(65) Prior Publication Data

US 2026/0105966 A1 Apr. 16, 2026

(51) Int. Cl.

*G11C 16/24* (2006.01)
*G11C 16/04* (2006.01)
*G11C 16/26* (2006.01)

(52) U.S. Cl.

CPC .......... *G11C 16/24* (2013.01); *G11C 16/0483* (2013.01); *G11C 16/26* (2013.01)

(58) Field of Classification Search

CPC ...... G11C 16/24; G11C 16/0483; G11C 16/26
See application file for complete search history.

(56) References Cited

U.S. PATENT DOCUMENTS

| | | | |
|---|---|---|---|
| 7,821,854 B2 | 10/2010 | Kobayashi | |
| 8,023,319 B2 | 9/2011 | Cho et al. | |
| 9,449,698 B1 | 9/2016 | Paudel et al. | |
| 9,715,924 B2 | 7/2017 | Mokhlesi et al. | |
| 9,899,077 B2 | 2/2018 | Hsu et al. | |
| 9,978,456 B2 | 5/2018 | Khandelwal et al. | |
| 10,083,743 B2 | 9/2018 | Perner | |
| 10,528,643 B1 | 1/2020 | Choi et al. | |
| 11,544,547 B2 | 1/2023 | Kulkarni et al. | |
| 11,934,480 B2 | 3/2024 | Lue et al. | |
| 2006/0133125 A1 | 6/2006 | So et al. | |
| 2006/0221692 A1 | 10/2006 | Chen | |
| 2007/0127291 A1 * | 6/2007 | Fong .................. | G11C 16/3427 365/185.17 |
| 2009/0080265 A1 | 3/2009 | Mokhlesi et al. | |
| 2019/0019538 A1 | 1/2019 | Li et al. | |
| 2020/0034697 A1 | 1/2020 | Choi et al. | |
| 2023/0154541 A1 | 5/2023 | Yuan et al. | |
| 2023/0245706 A1 | 8/2023 | Song et al. | |
| 2023/0317169 A1 | 10/2023 | Zhu et al. | |
| 2024/0005994 A1 | 1/2024 | Qiao et al. | |
| 2024/0161841 A1 | 5/2024 | Jeong | |

FOREIGN PATENT DOCUMENTS

EP 3671433 B1 * 11/2025 ............. G11C 16/26

OTHER PUBLICATIONS

International Search Report for PCT/US2025/026702 dated Aug. 22, 2025.

* cited by examiner

*Primary Examiner* — Sultana Begum

(74) *Attorney, Agent, or Firm* — PEARL COHEN LLP

(57) ABSTRACT

A non-volatile memory is divided into multiple zones of non-volatile memory cells. During a sensing operation that includes concurrently sensing total output current from a bit line while the bit line is concurrently receiving output current from multiple non-volatile memory cells that are in different zones, different voltages are applied to selected word lines in different zones based on how far a respective zone is from the bit line driver.

15 Claims, 21 Drawing Sheets

Figure 6

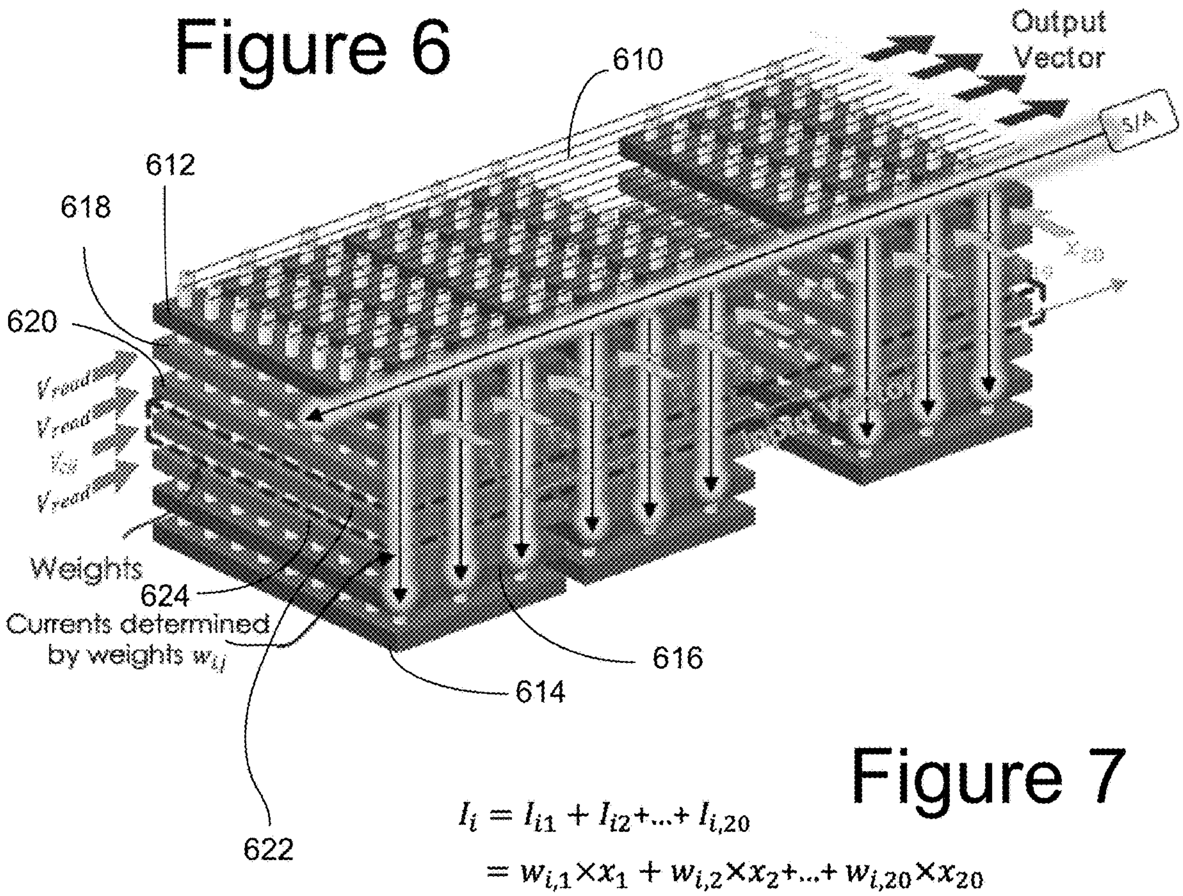

Figure 7

$$I_i = I_{i1} + I_{i2} + \ldots + I_{i,20}$$
$$= w_{i,1} \times x_1 + w_{i,2} \times x_2 + \ldots + w_{i,20} \times x_{20}$$
$$= \left[w_{i,1}, w_{i,2}, \ldots, w_{i,20}\right] \times \begin{bmatrix} x_1 \\ x_2 \\ \vdots \\ x_{20} \end{bmatrix}$$

$x_1$ → 0: SGD off, 1: SGD on

Figure 8

$$\text{Output Vector } \boldsymbol{I} = [I_1, I_2, \ldots, I_N] = \begin{bmatrix} w_{1,1}, w_{1,2}, \ldots, w_{1,N} \\ \vdots \\ w_{i,1}, w_{i,2}, \ldots, w_{i,N} \\ \vdots \\ w_{M,1}, w_{M,2}, \ldots, w_{M,N} \end{bmatrix} \times \begin{bmatrix} x_1 \\ x_2 \\ \vdots \\ x_N \end{bmatrix} = \boldsymbol{w} \times \boldsymbol{x}$$

Output vector (bitline current)

Weight (encoded by cell current)

Input vector ($SGD_i$ on/off)

| Zone No. | Zone_1 | Zone_2 | Zone_3 | Zone_4 | Zone_5 | ... | Zone_k |
|---|---|---|---|---|---|---|---|
| Block No. | $1 \sim j_1$ | $(j_1+1) \sim j_2$ | $(j_2+1) \sim j_3$ | $(j_3+1) \sim j_4$ | $(j_4+1) \sim j_5$ | ... | $(j_{k-1}+1) \sim n$ |
| Control gate voltage | *VCG* | $VCG+DVCG_1$ | $VCG+DVCG_2$ | $VCG+DVCG_3$ | $VCG+DVCG_4$ | ... | $VCG+DVCG_{k-1}$ |

| Zone No. | Zone_1 | Zone_2 | ... | Zone_10 |
|---|---|---|---|---|
| Block No. | 1 ~ 100 | 101 ~200 | ... | 901 ~ 1000 |
| Control gate voltage | *VCG* | $VCG+DVCG_1$ | ... | $VCG+DVCG_9$ |

NON-VOLATILE MEMORY WITH LOCATION DEPENDENT CONTROL GATE VOLTAGE

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory that the non-volatile memory operate reliably (e.g., user be able to successfully read back data stored in the non-volatile memory).

BRIEF DESCRIPTION OF THE DRAWINGS

Like-numbered elements refer to common components in the different figures.

FIG. 6 is a perspective view of a portion of one embodiment of a monolithic three dimensional memory structure.

FIGS. 7 and 8 provide mathematical details of performing vector-matrix multiplication on the structure of FIG. 6.

DETAILED DESCRIPTION

A non-volatile memory system is proposed for operating as an inference engine with a pre-trained model in order to implement an Artificial Intelligence ("AI") system. The pre-trained model comprises weights stored in the non-volatile memory system. Thus, in one set of embodiments, the non-volatile memory system programs weights into non-volatile memory cells and performs vector-matrix multiplication (i.e., inferencing) using the weights programmed in the non-volatile memory cells.

In some embodiments, the weights are represented by current flowing through the non-volatile memory cells. Due to IR drops along signal lines, such as (for example) bit lines, currents sensed through memory cells at different physical locations may appear to be different current levels even though the memory cells store the same weights. To address this issue, it is proposed that a non-volatile memory is divided into multiple zones of non-volatile memory cells. During a sensing operation that includes concurrently sensing total output current from a bit line while the bit line is concurrently receiving output current from multiple non-volatile memory cells that are in different zones, different voltages are applied to selected word lines in different zones based on how far a respective zone is from the bit line driver. This technology can also be used with non-volatile memory that is not operating as an inference engine.

Figure 1:
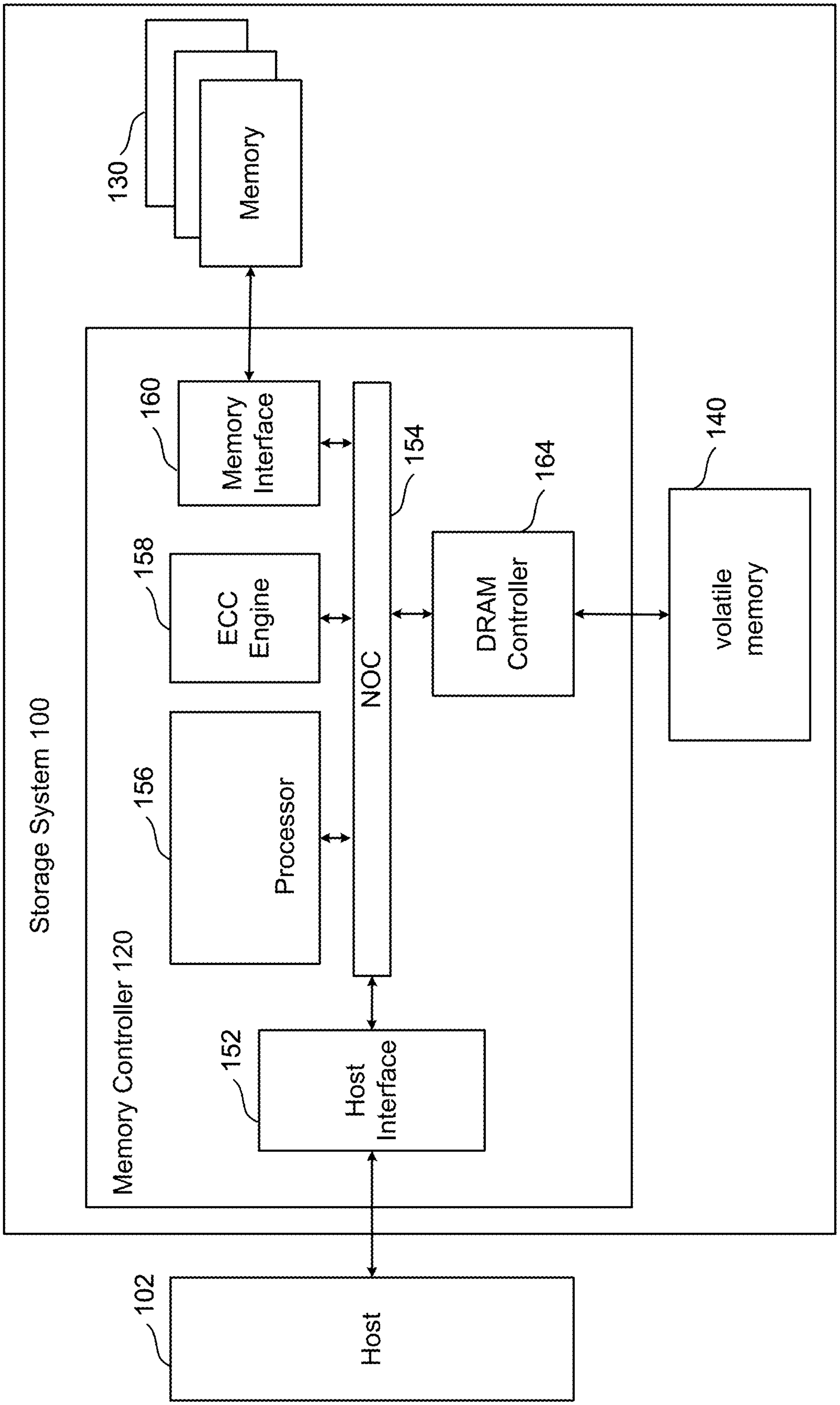
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
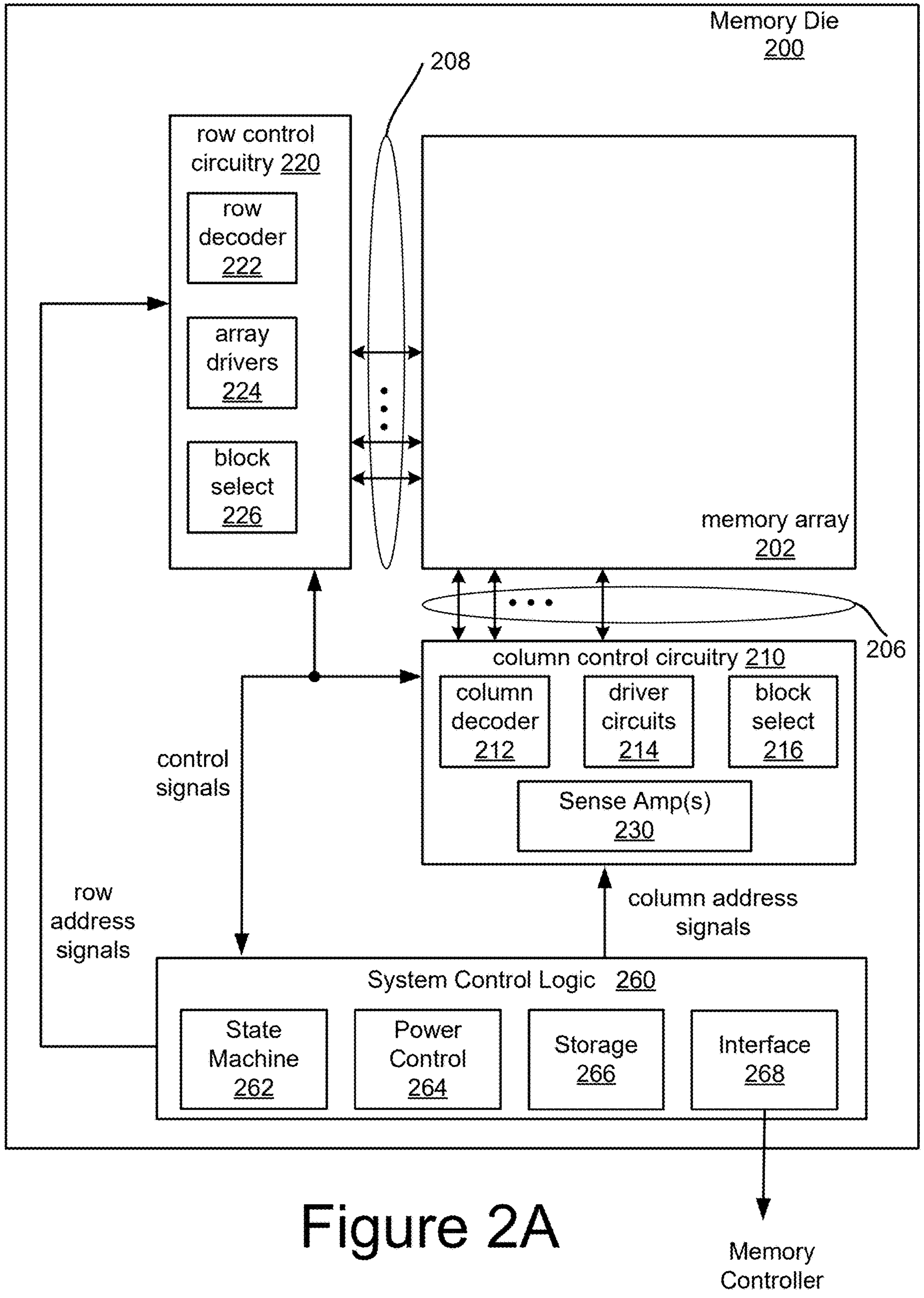
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations and may include charge pumps and regulator circuit for creating regulating voltages. System control logic 260 includes storage 366

(e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
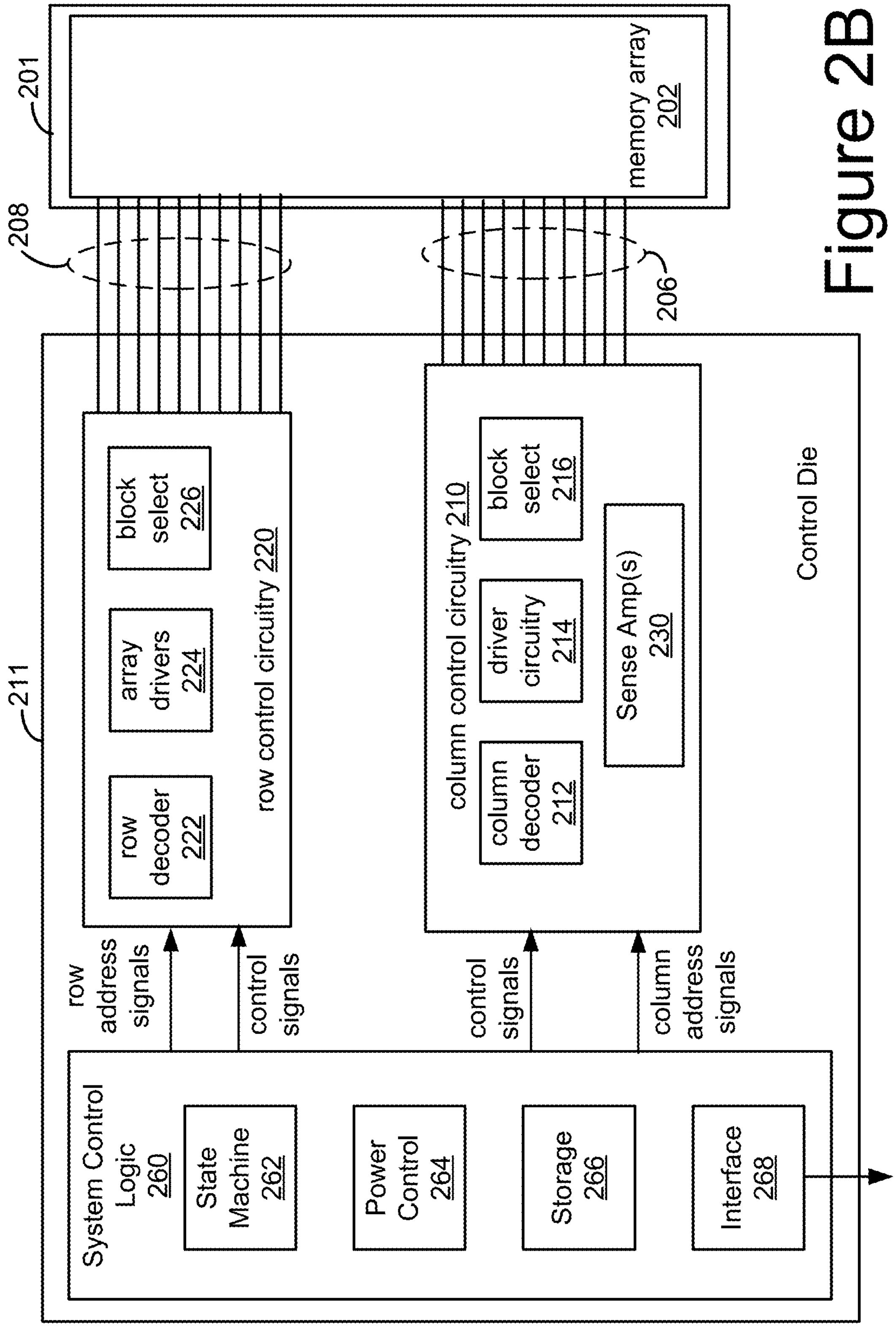
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 2C:
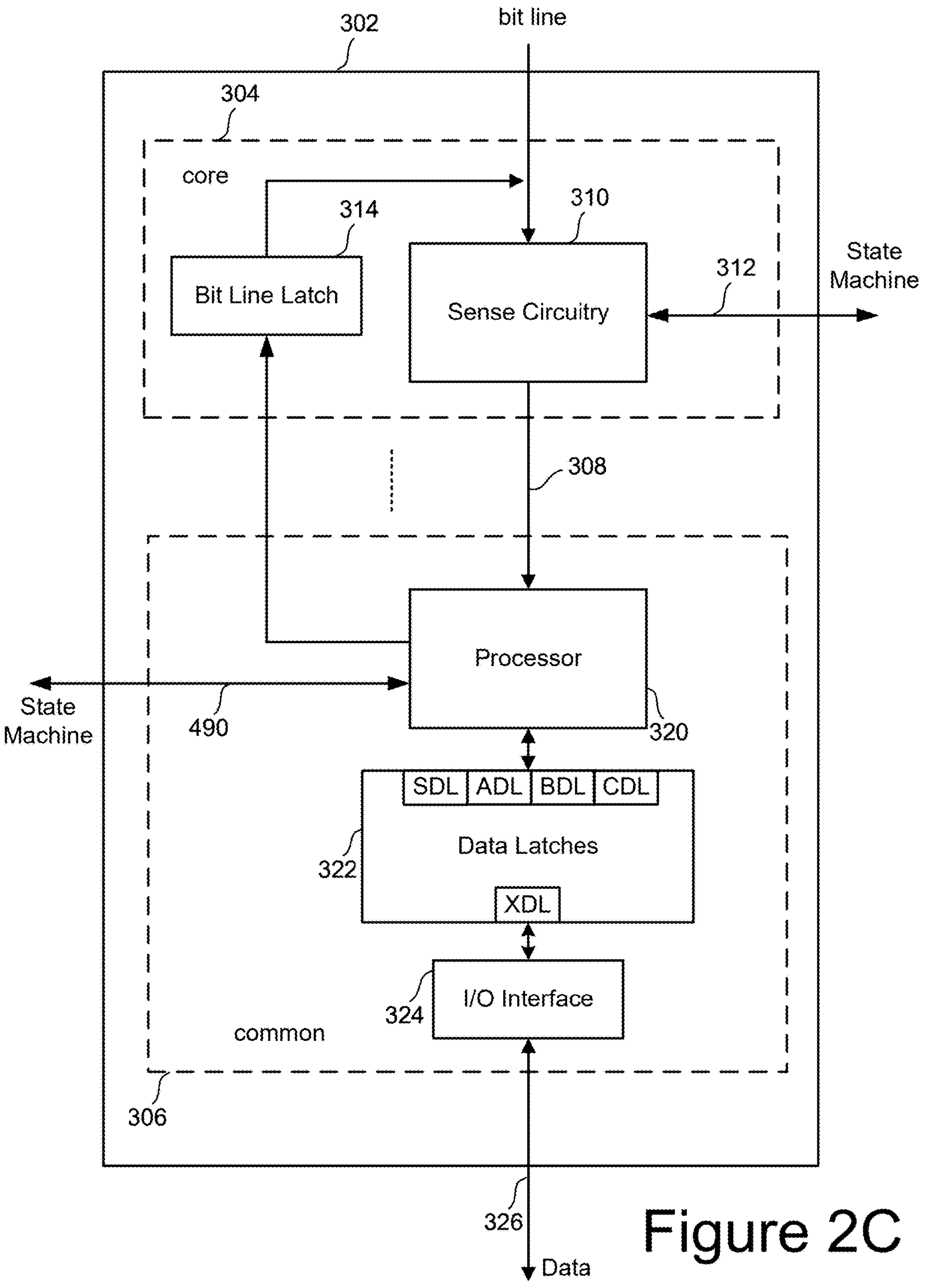
FIG. 2C depicts details of an individual sense block.

FIG. 2C is a block diagram depicting an individual sense block 302 of sense amplifiers 230 partitioned into a core portion 304 (referred to as a sense module 304) and a common portion 306. In one embodiment, there will be a separate sense module 304 for each bit line and one common portion 306 for a set of multiple sense modules 304. In one example, a sense block 302 will include one common portion 306 connected to eight, twelve, or sixteen sense modules 304. Each of the sense modules 304 in a group will communicate with the associated common portion 306 via a data bus 308. In one embodiment, sense amplifiers 230 will include many sense blocks 302.

Sense module 304 comprises sense circuitry 310 that determines whether a conduction current in a connected bit line is above or below a predetermined level or, in voltage based sensing, whether a voltage level in a connected bit line is above or below a predetermined level. The sense circuitry 310 is to receive control signals from the state machine via input lines 312. In some embodiments, sense circuitry 310 includes a circuit commonly referred to as a sense amplifier. Sense module 304 also includes a bit line latch 314 that is used to set a voltage condition on the connected bit line. For example, a predetermined state latched in bit line latch 314 will result in the connected bit line being pulled to a state designating program inhibit (e.g., VDD).

Common portion 306 comprises a processor 320, data latches 322 and an I/O Interface 324 coupled between the set of data latches 322 and data bus 326. Processor 320 performs computations. For example, one of its functions is to determine the data stored in the sensed memory cell and store the determined data in the set of data latches. The set of data latches 322 is used to store data bits determined by processor 320 during a read operation. It is also used to store data bits imported from the data bus 326 during a program operation. The imported data bits represent write data meant to be programmed into the memory. I/O interface 324 provides an interface between data latches 322 and the data bus 326.

During read or sensing, the operation of the system is under the control of state machine 262 that controls (using power control 264) the supply of different control gate or other bias voltages to the addressed memory cell(s). As it steps through the various predefined control gate voltages corresponding to the various memory states supported by the memory, the sense module 304 may trip at one of these voltages and an output will be provided from sense module 304 to processor 320 via bus 308. At that point, processor 320 determines the resultant memory state by consideration of the tripping event(s) of the sense module 304 and the information about the applied control gate voltage from the state machine via signal lines 490. It then computes a binary encoding for the memory state and stores the resultant data bits into data latches 322. In another embodiment, bit line latch 314 serves double duty, both as a latch for latching the output of the sense module 304 and also as a bit line latch as described above.

Data latch stack 322 contains a stack of data latches corresponding to an associated sense module 304. In one embodiment, there are three, four or another number of data latches per sense module 304. In one embodiment, the latches are each one bit (e.g., one bit per sense module 304). In one embodiment, the latches for each sense module 304 will be referred to as SDL, XDL, ADL, BDL, and CDL. Thus, in one embodiment, each sense module 304 has its own set of SDL, XDL, ADL, BDL, and CDL. In the embodiments discussed here, the latch XDL is a transfer latch used to exchange data with the I/O interface 324. In addition to a first sense amplifier data latch SDL, the additional latches ADL, BDL and CDL can be used to hold data.

During program or verify, the data to be programmed is stored in the set of data latches 322 from the data bus 326. During the verify process, Processor 320 monitors the verified memory state relative to the desired memory state. When the two are in agreement, processor 320 sets the bit line latch 314 so as to cause the bit line to be pulled to a state designating program inhibit. This inhibits the memory cell coupled to the bit line from further programming even if it is subjected to programming pulses on its control gate. In other embodiments the processor initially loads the bit line latch 468 and the sense circuitry sets it to an inhibit value during the verify process.

In some implementations (but not required), the data latches are implemented as a shift register so that the parallel data stored therein is converted to serial data for data bus 326, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 3A:
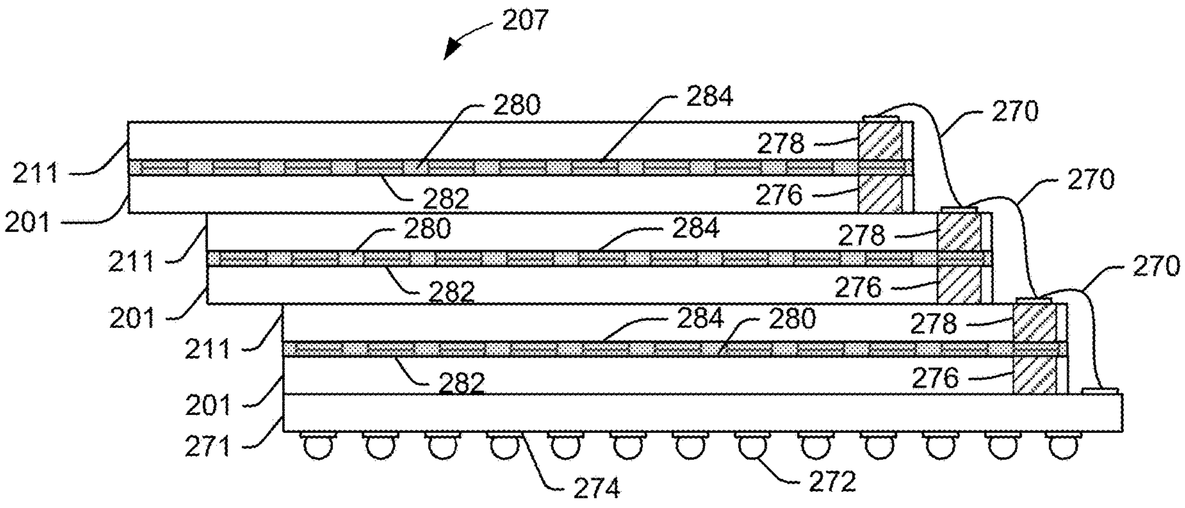
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
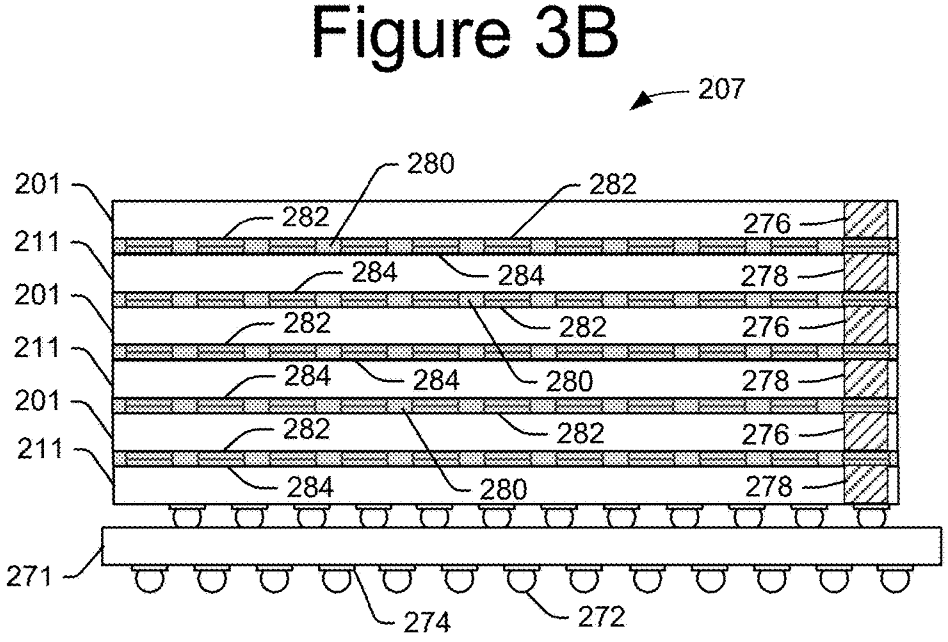

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
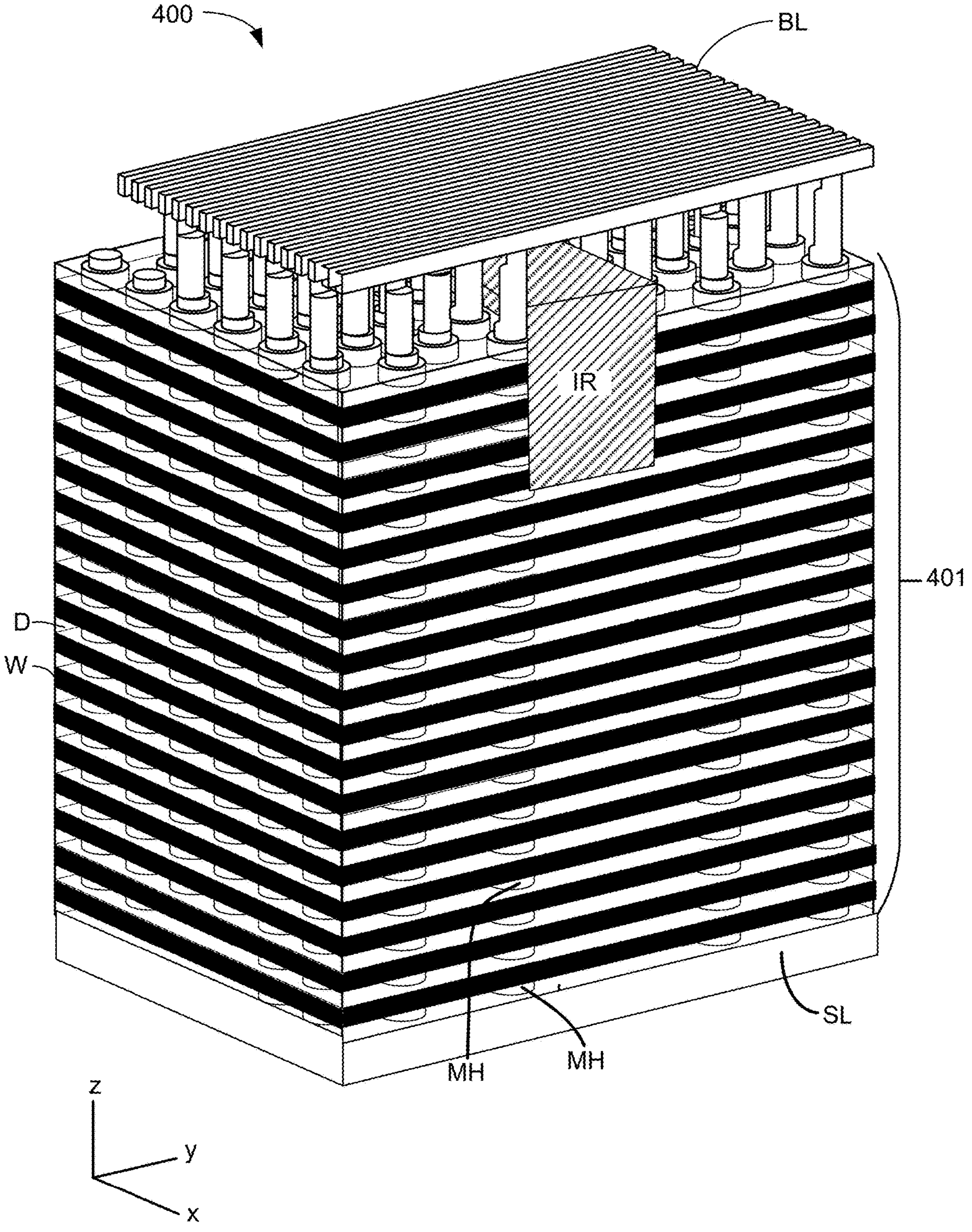
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
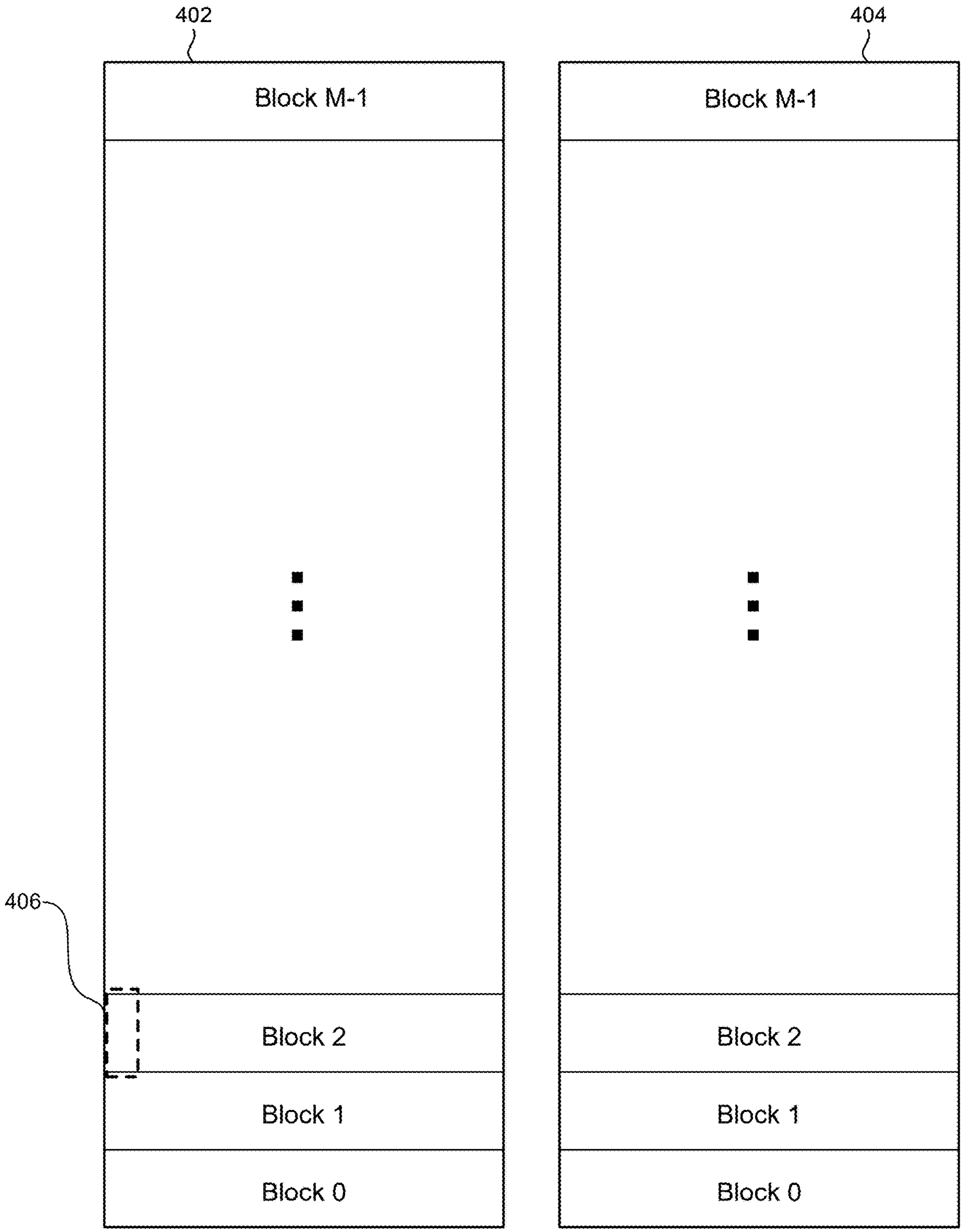
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
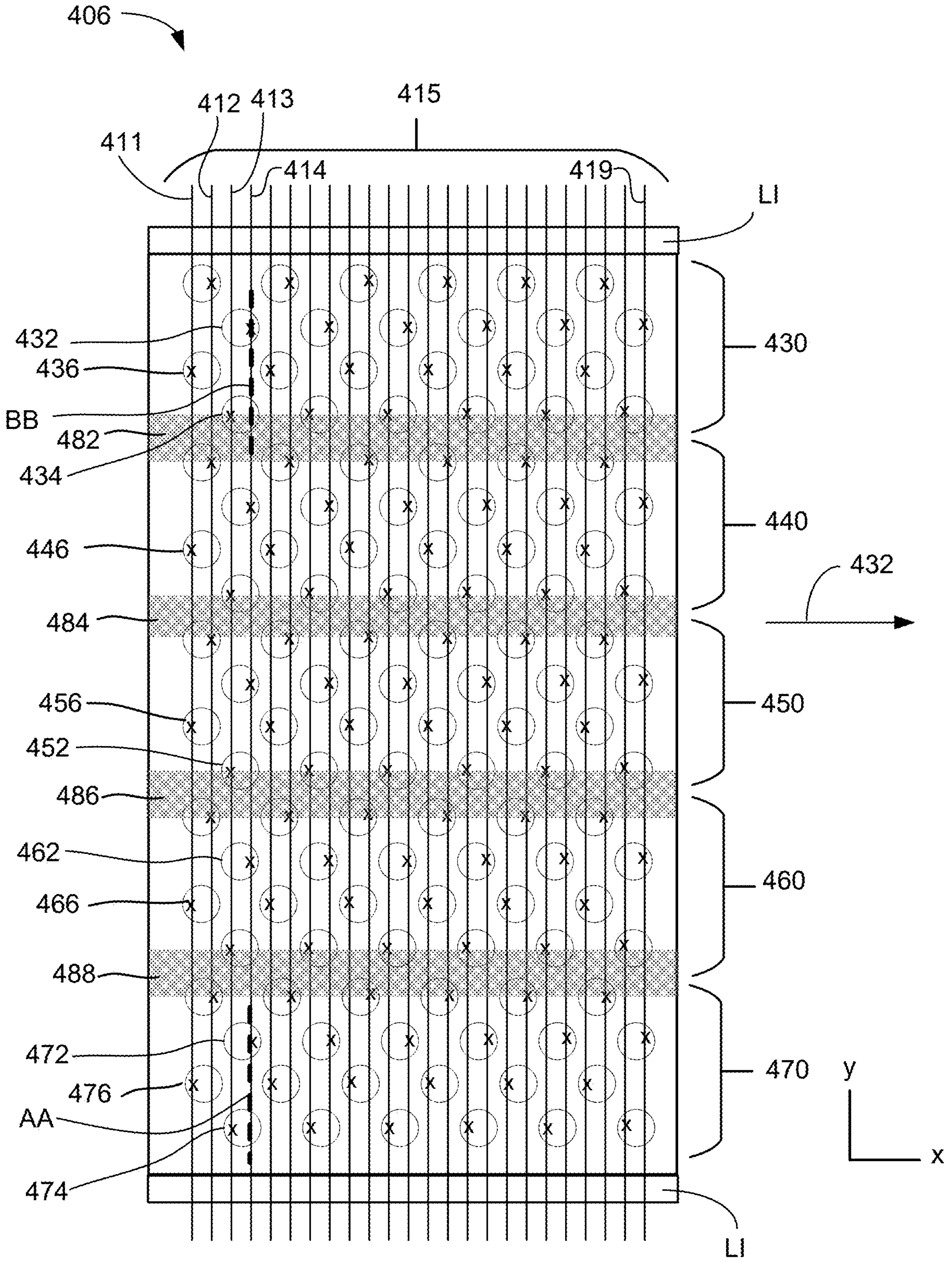
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/NAND strings connected to a common bit line are connected to the same set of word lines; therefore, the system uses the drain side select lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
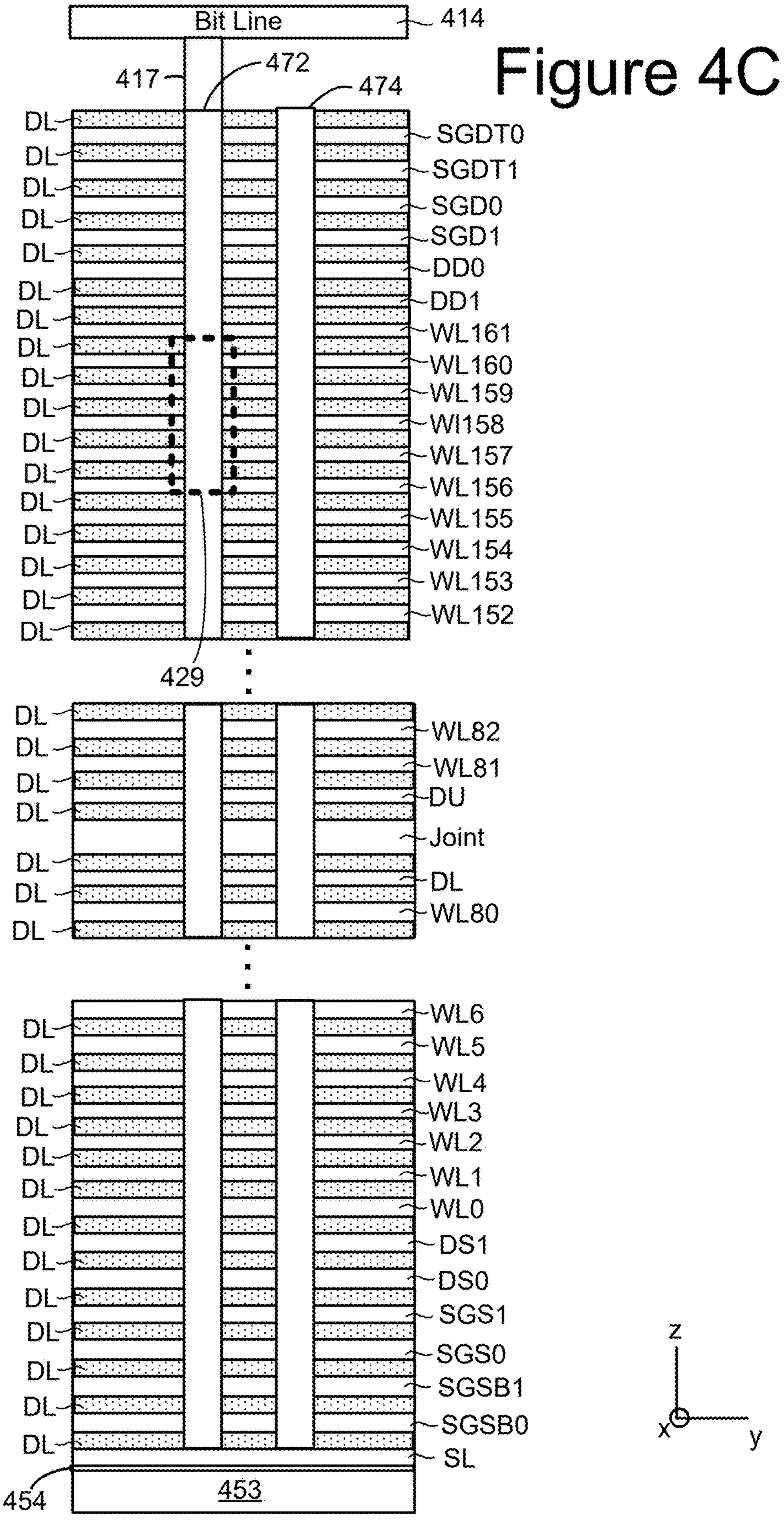
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through memory holes/vertical columns (NAND strings) 472 and 474 of region 470 (see FIG. 4B). The structure of FIG. 4C includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less number of SGSs (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string; however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/Vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C show vertical memory hole/column 472 connected to bit line 414 via connector 417.

For case of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To ease this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
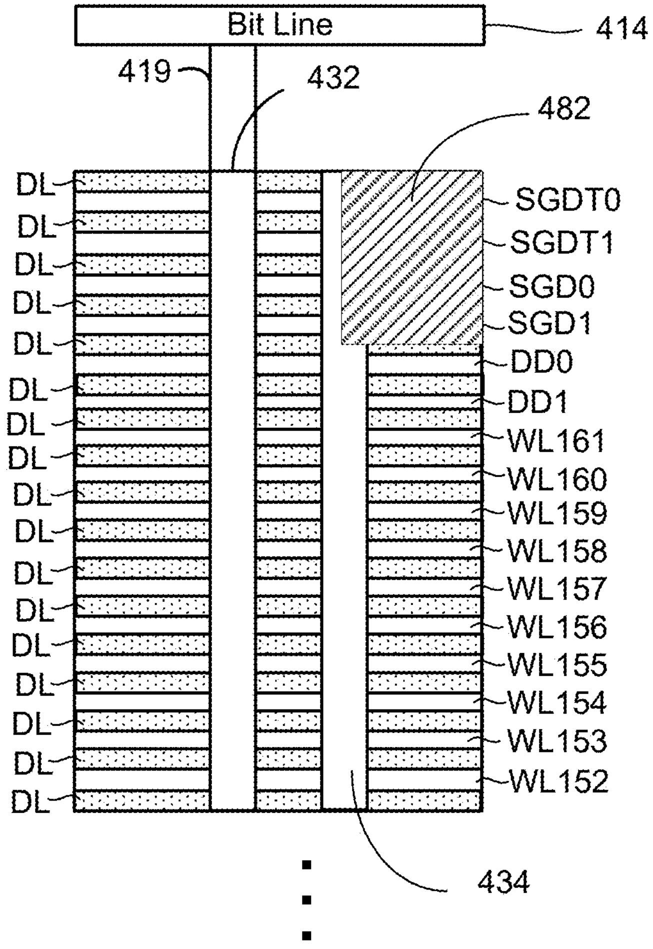
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488 occupy space that would have been used for a portion of the memory holes/vertical columns/NAND stings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
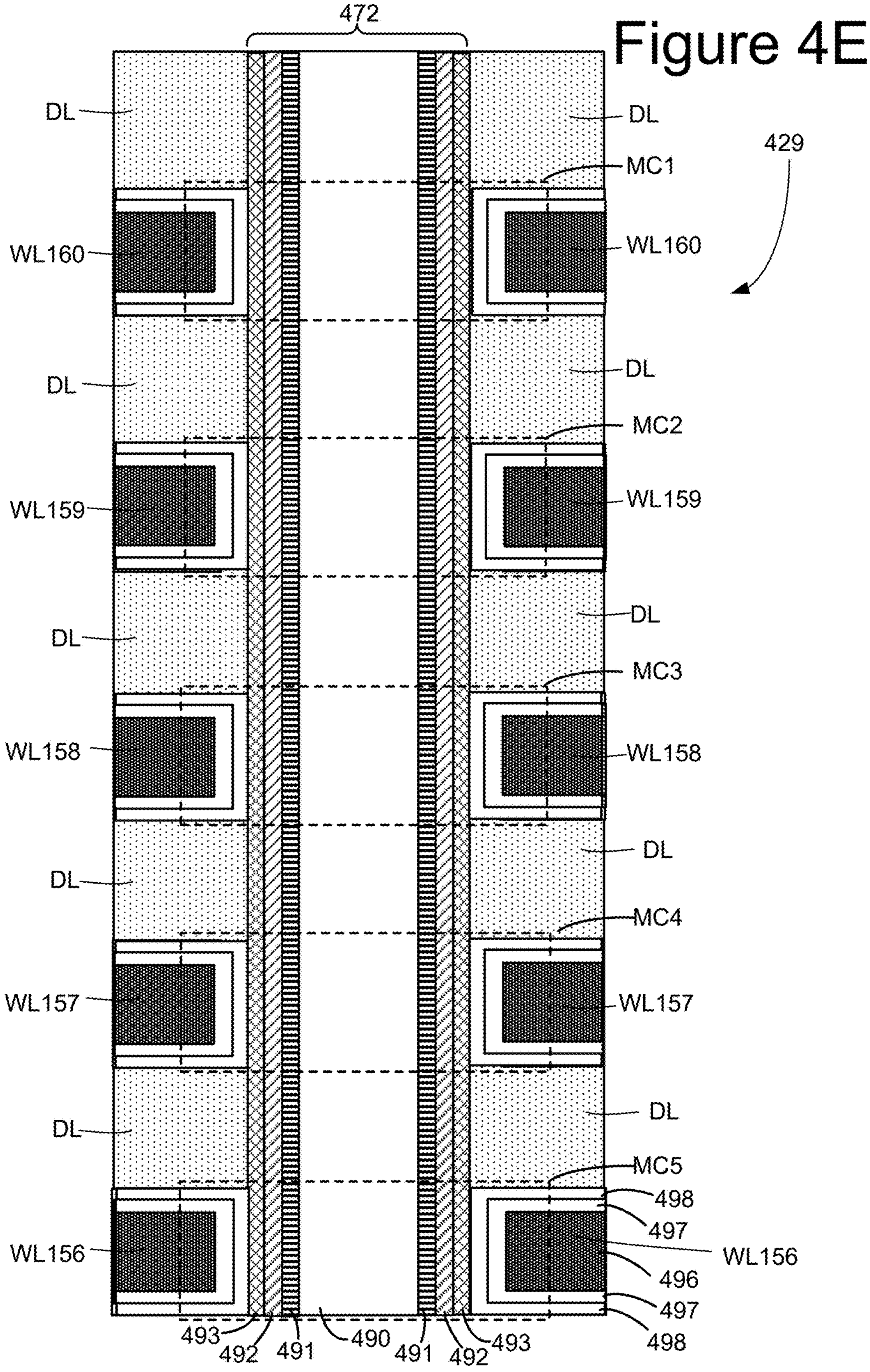
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
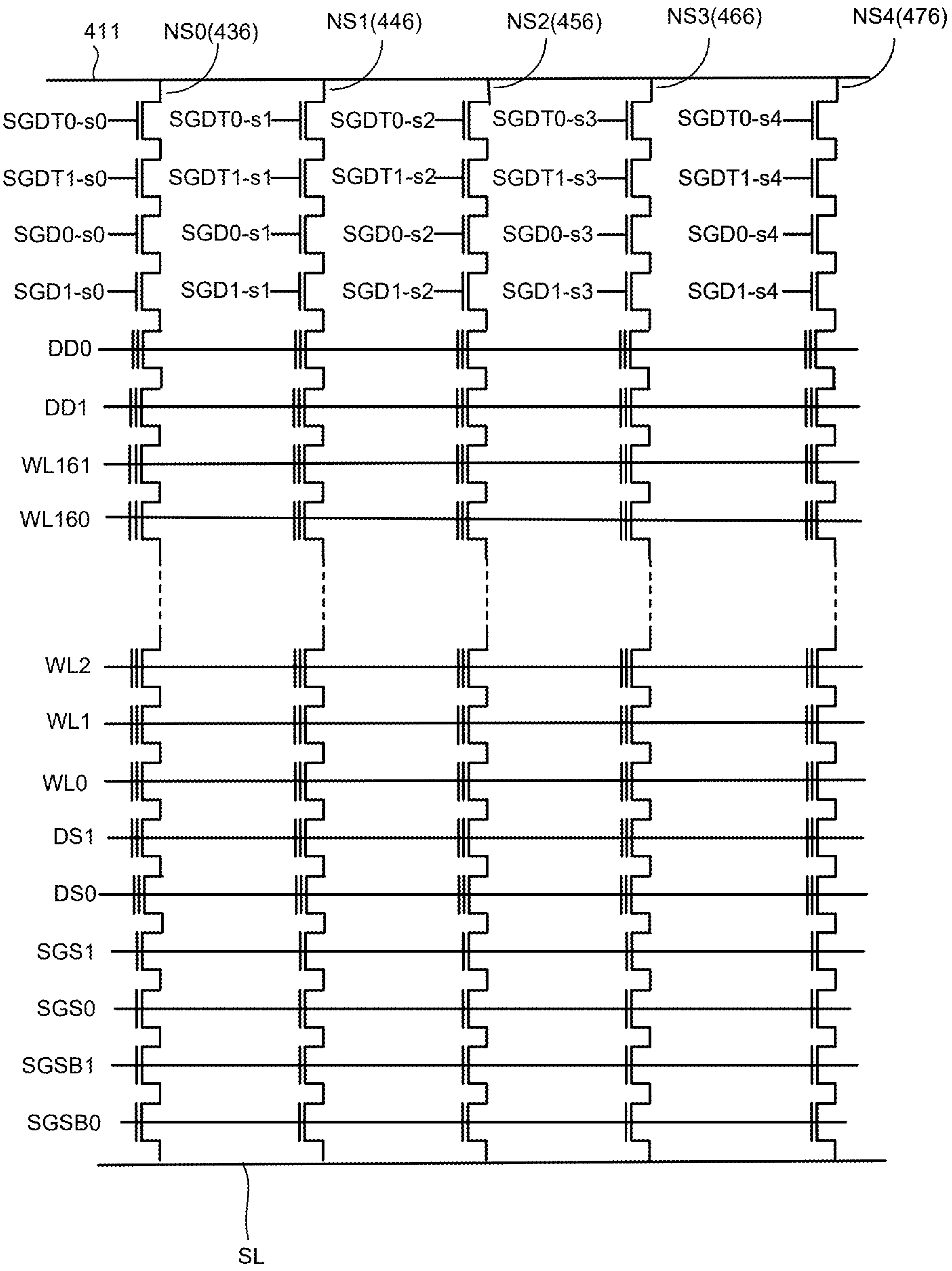
FIG. 4F is a schematic of a plurality of NAND strings in multiple regions of a same block.

FIG. 4F is a schematic diagram of a portion of the three dimensional memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/vertical column 466 of region 460), and NAND string NS4 (which corresponds to memory hole/vertical column 476 of region 470).

Drain side select line/layer SGD0 is separated by isolation regions 482, 484, 486 and 488 to form SGD0-*s*0, SGD0-*s*1, SGD0-*s*2, SGD0-*s*3 and SGD0-*s*4 in order to separately connect to and independently control regions 430, 440, 450, 460, 470. Similarly, drain side select line/layer SGD1 is separated by isolation regions 482, 484, 486 and 488 to form SGD1-*s*0, SGD1-*s*1, SGD1-*s*2, SGD1-*s*3 and SGD1-*s*4 in order to separately connect to and independently control regions 430, 440, 450, 460, 470; drain side GIDL generation transistor control line/layer SGDT0 is separated by isolation regions 482, 484, 486 and 488 to form SGDT0-*s*0, SGDT0-*s*1, SGDT0-*s*2, SGDT0-*s*3 and SGDT0-*s*4 in order to separately connect to and independently control regions 430, 440, 450, 460, 470; drain side GIDL generation transistor control line/layer SGDT1 is separated by isolation regions 482, 484, 486 and 488 to form SGDT1-*s*0, SGDT1-*s*1, SGDT1-*s*2, SGDT1-*s*3 and SGDT1-*s*4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein. The memory systems discussed above can be erased, programmed and read.

The memory structures described above can be used with artificial intelligence and machine learning applications.

Figures 5A, 5B:
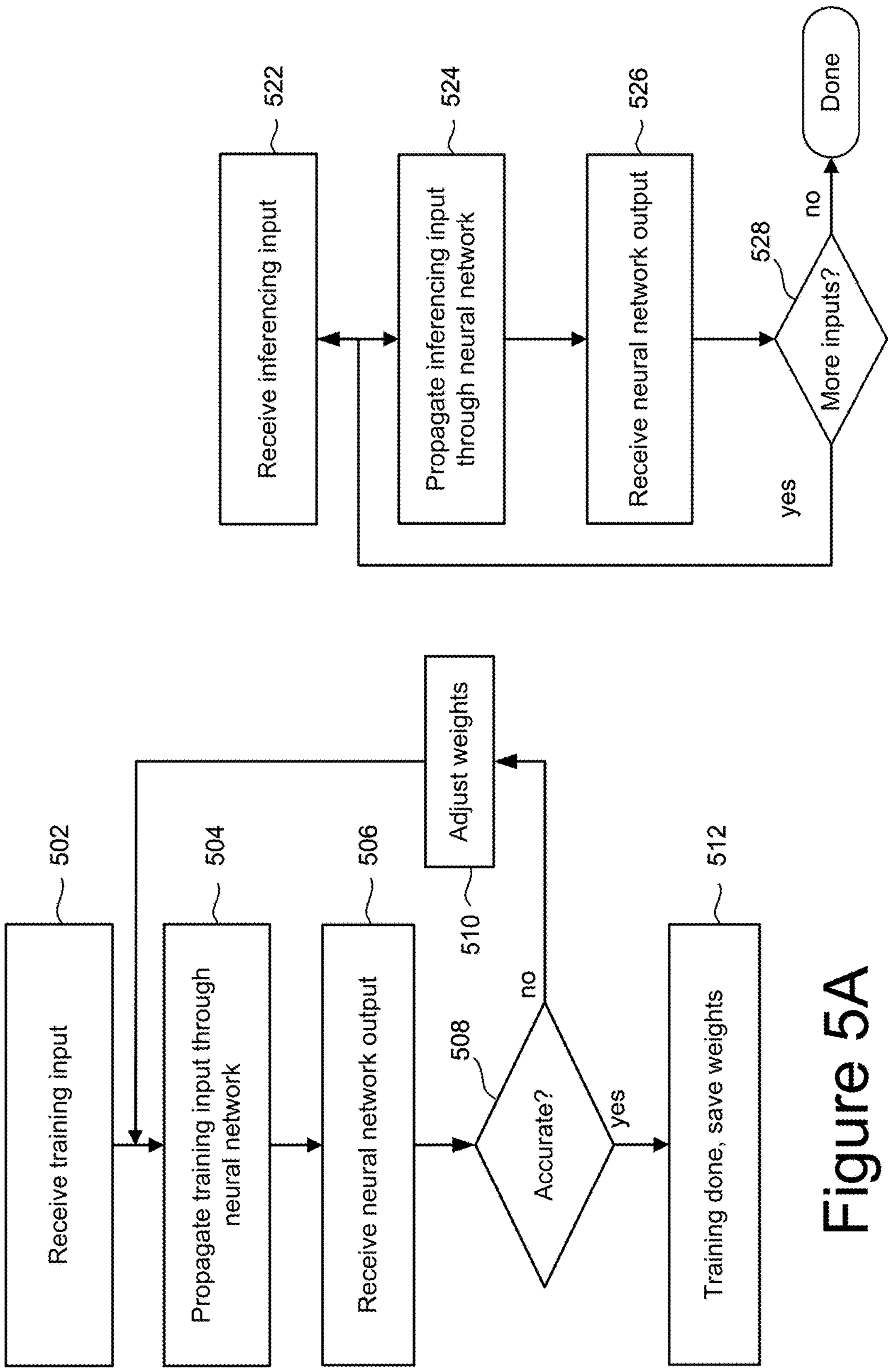
FIG. 5A is a flow chart describing one embodiment of a process for training a model.
FIG. 5B is a flow chart describing one embodiment of a process for using a model with an inference engine.

Artificial neural networks are finding increasing usage in artificial intelligence and machine learning applications. In an artificial neural network, a set of inputs is propagated through one or more intermediate, or hidden, layers to generate an output. The layers connecting the input to the output are connected by one or more sets of weights that are generated in a training or learning phase by determining a set of a mathematical manipulations to turn the input into the output, moving through the layers calculating the probability of each output. Once the weights are established, they can be used in the inference phase to determine the output from a set of inputs. The set of weights can be referred to as a model. The determining of the weights is referred to as training the model. FIG. 5A is a flow chart describing one embodiment of a process for training a model. The use of the weights with real data is referred to as the inference phrase and is performed by using the neural network as an inference engine. FIG. 5B is a flow chart describing one embodiment of a process for using a trained model with the neural network as an inference engine.

An artificial neural network is "trained" by supplying inputs and then checking and correcting the outputs. For example, a neural network that is trained to recognize dog breeds will process a set of images and calculate the probability that the dog in an image is a certain breed. During training, a user can review the results and return the proposed label. Each mathematical manipulation when determining an answer is considered a layer, and complex neural networks have many layers. Due to the depth provided by a large number of intermediate or hidden layers, neural networks can model complex non-linear relationships as they are trained.

FIG. 5A is a flowchart describing one embodiment of a process for training a model to generate a set of weights. The training process is often performed in the cloud, allowing additional or more powerful processing engines to be accessed. At step 502, the input, such as a set of images, is received. At step 504 the input is propagated through the layers of the neural network using the set of weights. The neural network's output is then received at the output in step 506. In one example of a neural network designed to recognize dog breeds, the input would be the image data of a number of dogs, and the one or more intermediate layers use the current weight values to calculate the probability that the dog in an image is a certain breed, with the proposed dog breed label returned at step 506. A user can then review the results at step 508 to select which probabilities the neural network should return and decide whether the current set of weights supply a sufficiently accurate labelling and, if so, the training is complete (step 512). If the result is not sufficiently accurate, the neural network adjusts the weights at step 510 based on the probabilities the user selected, followed by looping back to step 504 to run the input data again with the adjusted weights. Once the neural network's set of weights have been determined, they can be used to "inference," which is the process of using the determined weights to generate an output result from data input into the neural network. Once the weights are determined at step 512, they can then be stored in non-volatile memory for later use, where the storage of these weights in non-volatile memory is discussed in further detail below.

FIG. 5B is a flowchart describing a process for the inference phase to predict a result from the input data. At step 522, the input is received, such as the image of a dog in the example used above. At step 524, the input data is then propagated through the neural network's one or more layers using the weights established at the end of the training process at step 512. After propagating the input through the layers, the output is then provided at step 526. If there are more inputs to process (step 528), then the method loops back to step 522; otherwise, the inferencing is completed.

Figure 5C:
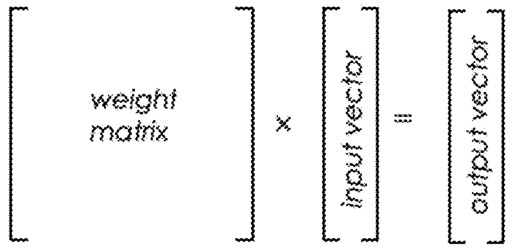
FIG. 5C depicts vector-matrix multiplication.

A basic operation used in artificial intelligence and machine learning applications (e.g., used by the neural network as an inference engine) is vector-matrix multiplication (VMM), which comprises multiplying an input vector by a weight matrix, resulting in an output vector, as depicted in FIG. 5C. VMM is used at each layer of a neural network.

Although neural networks can provide highly accurate results, they are extremely computationally intensive, require the storage of an enormous amount of data (e.g., the weights) and the data transfers involved in reading the weights from memory into the processors can be time intensive. For example, an artificial intelligence/machine learning application may need to store 175 billion weights. Prior systems store weights in DRAM, which is very expensive. When needed, the weights are transferee to a GPU, which wastes time. To overcome both of these issues, it is proposed to store the weights in non-volatile memory, such as the NAND memory discussed above with respect to FIGS. 4-4F. Such NAND memory is significantly less expensive than DRAM. Furthermore, the non-volatile memory can be configured to perform the vector-matrix multiplication in-memory using the weights stored in the non-volatile memory as part of the inference phase, thereby, removing the need to transfer the weights to an external processor that is implementing the inference engine. Thus, using the non-volatile memory to store the weights and preform the vector-matrix multiplication increases performance (e.g., not wasting time on large data transfers) and reduces cost (NAND is cheaper than DRAM).

FIG. 6 is a perspective view of a portion of one embodiment of the monolithic three dimensional memory structure of FIGS. 4-4F configured to perform vector-matrix multiplication. The memory structure includes many memory holes/vertical columns implementing NAND strings. The NAND strings comprise non-volatile memory cells and select gates, as discussed above. The NAND strings are grouped into a plurality of blocks (see e.g., FIG. 4A). The portion of the memory depicted in FIG. 6 includes bit lines 610 connected to the top of the NAND strings, a drain side select line 612 (e.g., any of SGD0 or SGD1) connected to drain side select gates of the NAND strings, source side select lines 614 and 616 (e.g., SGS1 and SGS0) connected to source side select gates of the NAND strings and data word lines 618, 620, 622 and 624 (e.g., any of WL0-WL161) connected to the memory cells of the NAND strings. Each of the bit lines 610 are connected to NAND strings in every block of the plurality of blocks (e.g., connected to Block 0-Block M−1 of FIG. 4A). In one embodiment, each bit line is connected to one NAND string in every region (e.g., of regions 430, 440, 450, 460 and 470 of FIG. 4B) of every block of a plane. FIG. 6 is simplified to only show a subset of the data word lines, bit lines and select lines in order to make the drawing easier to read; however, the memory of FIG. 6 will include all of the structures depicted in FIGS. 4B-4E (including all of the word lines and select lines describe above). Each of the memory cells stores weight information (which can be a weight or information from which the weight can be derived). The weights are stored in the memory cells as part of step 512 of FIG. 5A.

To perform vector-matrix multiplication in and by the non-volatile memory, using the weights stored in the memory cells of the non-volatile memory, the control circuit applies read enable voltages to the word lines (e.g., applies Veg to the word line 622 connected to the memory cells selected for sensing because they are storing the weights needed for the VMM and applies Vread [an overdrive voltage ~5-8 v] to word lines 618/620/624 that are not selected); applies an input vector to one or more select lines (e.g., select line 612) while applying the read enable voltages to the word lines, and senses an output vector from the bit lines 610 using the senses amplifiers (S/A) 230. The voltage Veg is one example of a reference voltage, discussed below. The sensed output vector is a set of output currents sensed on bit lines 610. In one embodiment, each bit line is connected to one NAND string in every region of every block of a plane; therefore, the bit line can potentially receive current concurrently from multiple NAND strings (ie one NAND string in each region of each block of a plane). The current received at the bit line from the multiple NAND strings is added together such that the sense amplifier senses the sum of the current from the multiple NAND strings. This is described by the math of FIG. 7 which shows the total current sensed on bit line i, labeled as $I_i$, is the sum of the current In from a first NAND string, the current $I_{i2}$ from a second NAND string, . . . the current $I_{i20}$ from a twentieth NAND string, etc. FIG. 7 shows math for twenty NAND strings but in other embodiments, a bit line can be connected to and concurrently receiving current from hundreds or thousands of NAND strings. In one embodiment, there are 16 K bit lines. The current from any given NAND string is the product of the weight stored in the selected memory cell in the NAND string and the magnitude at the relevant position of the input vector. For example, the current In from the first NAND string is $I_{i1}=w_{i,1}(x_1)$, where $w_{i,1}$ is the weight stored in the selected memory cell (connected to word line 622) on the first NAND string and $x_1$ is the magnitude of the signal on the SGD line 612 connected to the first NAND string. In one embodiment, the SGD line is either logic 1 (on) or logic 0 (off). FIG. 8 indicates that the output vector I includes each of the current magnitudes from the multiple bit lines 610, and represents the product the matrix of weights ($w_{x,y}$) and the input vector ($x_1$, $x_2$, . . . $x_N$).

Figure 9:
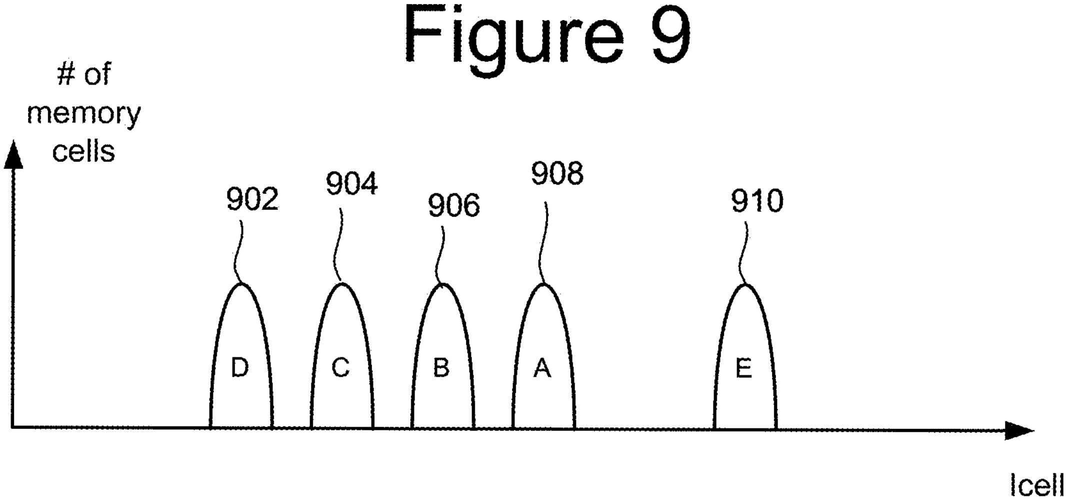
FIG. 9 depicts current distributions.

In one embodiment, the weights are stored in the memory cells as analog values representing current that will flow though the memory cells (e.g., between the source and drain) when applying a reference voltage to the gate (encoding weight information as memory cell current in the memory cells). In one example implementation, the memory cells can be programmed to store any current magnitude (e.g., an analog value or an integer). In another embodiment, the non-volatile memory cells are configured to be programmed into a set of data states defined by current distributions when applying a common voltage (e.g., Vcg) to the non-volatile memory cells. For example, FIG. 9 depicts current distributions 902, 904, 906, 908 and 910. Current distribution 910 represents erased memory cells (the erased state or unprogrammed state). From the erased state, memory cells can be programmed to current distribution 908 (representing data state A), current distribution 906 (representing data state B), current distribution 904 (representing data state C), and current distribution 902 (representing data state D). All of the memory cells in data state A are storing the same weight. That is, when applying a reference voltage (e.g., Veg) to the gate of the memory cells, a current will flow between the source and the drain that has a magnitude in current distribution 908. All of the memory cells in data state B are storing the same weight such that when applying a reference voltage to the gate of the memory cells, a current will flow between the source and the drain that has a magnitude in current distribution 906. All of the memory cells in data state C are storing the same weight such that when applying a reference voltage to the gate of the memory cells, a current will flow between the source and the drain that has a magnitude in current distribution 904. All of the memory cells in data state D are storing the same weight such that when applying a reference voltage to the gate of the memory cells, a current will flow between the source and the drain that has a magnitude in current distribution 902. In one example embodiment, current distribution 908 is centered at 80 nA, current distribution 906 is centered at 60 nA, current distribution 904 is centered at 40 nA, and current distribution 902 is centered at 20 nA. In the embodiment of FIG. 9, memory cells can store four different magnitudes of weights. In other embodiments, memory cells can store more than four different magnitudes of weights by implementing more current distributions.

Figure 10:
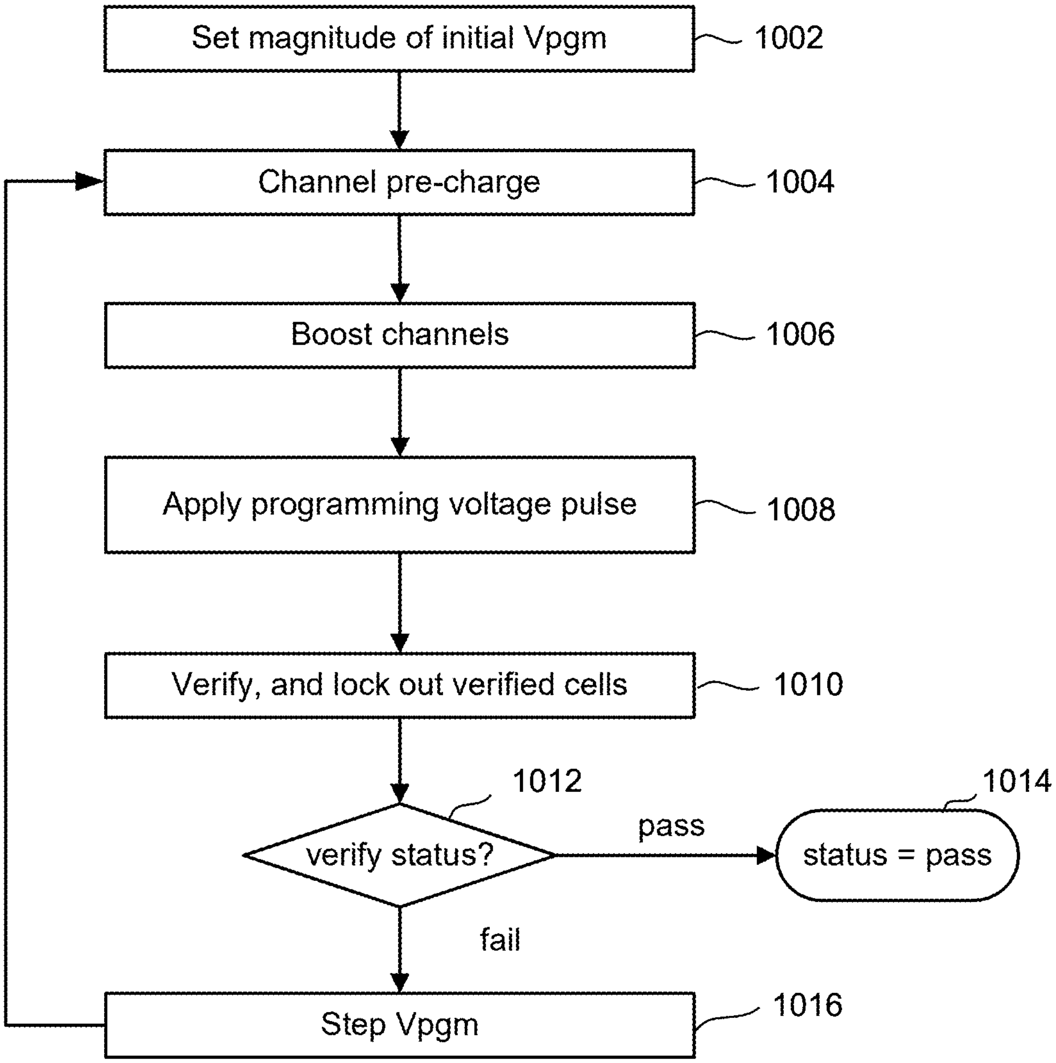
FIG. 10 is a flow chart describing one embodiment of a process for programming non-volatile memory.

FIG. 10 is a flow chart describing one embodiment of a process for programming weights into memory cells (encoding the weight information as memory cell current in the memory cells). The process of FIG. 10 can be performed as part of step 512 of FIG. 5A. In some example implementations, the process of FIG. 10 can be performed by any one of the one or more control circuits discussed above. The process of FIG. 10 can be performed entirely by a control circuit on memory die 200 (see FIG. 2A) or entirely by a control circuit on integrated memory assembly 207 (see FIG. 2B), rather than by memory controller 120. In one example, the process of FIG. 10 is performed by or at the direction of state machine 262, using other components of System Control Logic 260, Column Control Circuitry 210 and Row Control Circuitry 220. In another embodiment, the process of FIG. 10 is performed by memory controller 120 in combination with System Control Logic 260, Column Control Circuitry 210 and Row Control Circuitry 220. In some embodiments, the process of FIG. 10 is performed on any of the non-volatile memories discussed above.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 1002 of FIG. 10, the programming voltage signal (Vpgm) is initialized to the starting magnitude (e.g., ~12-16 V or another suitable level). In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1004 the control circuit will pre-charge channels of NAND strings that include memory cells connected to the selected word line that are to be inhibited from programming. In step 1006, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND strings.

In step 1008, a program voltage pulse of the programming voltage signal Vpgm is applied to the selected word line (the word line selected for programming). If a memory cell on a NAND string should be programmed, then the corresponding bit line is biased at a program enable voltage. In step 1008, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1010, program-verify is performed, which includes testing whether memory cells being programmed have successfully reached their target data state. Memory cells that have reached their target states are locked out from further programming by the control circuit. Step 1010 includes performing verification of programming by applying a reference voltage to the selected word line (which is connected to the gates of the selected memory cells) and sensing the current flowing in the NAND strings. In one embodiment, the sense amplifiers are designed to sense for the current magnitudes at the center (or edge) of each of the current distributions 902-910. In one embodiment, the verification process is performed by testing whether the current flowing through the memory cells selected for programming have reached the appropriate magnitude. In step 1010, a memory cell may be locked out after the memory cell has been successfully verified that the memory cell has reached its target data state.

If all memory cells have successfully verified (step 1012), then the programming process has completed successfully. In one embodiment, the programming process is completed successfully when a sufficient number of memory cells (but not all) have successfully verified, where an example of a sufficient number of memory cells is a number less than the number of bits than can be corrected by error correction techniques. If all memory cells have not yet successfully verified or a sufficient number of memory cells have not yet successfully verified (step 1012), then the programming voltage signal Vpgm (applied to the selected word line) is stepped up to the next magnitude and the process continues at step 1004 to apply the next programming pulse. For example, the next pulse will have a magnitude greater than the previous pulse by a step size ΔVpgm (e.g., a step size of 0.1-1.0 volts).

In one embodiment memory cells are erased prior to programming. Erasing is the process of changing the threshold voltage of one or more memory cells so that they will conduct current in data state E (current distribution 910) in response to the reference voltage. In some embodiments, a memory cell in data state E is said to be erased, in the erased condition or in the unprogrammed condition. In some embodiments, being in an unprogrammed condition means to be in a condition such that the memory cell is outside of the window of valid data states, such as (for example) having a memory cell current greater than the memory cells currents associated with data state A (with an optional margin) and less than the memory cells currents associated with data state D (with an optional margin).

At the end of the programming process of FIG. 10, the memory cells will be in the current distributions of FIG. 9. In an ideal world, memory cells programmed to 40 nA would conduct exactly 40 nA in response to the reference voltage. However, due to the variance in real world physical devices a population of memory cells programmed to 40 nA will conduct 40 nA+/−Δ in response to the reference voltage. This Δ is what causes the memory cells to be in a current distribution (rather than a spike on the graph). However, to minimize errors and maximize accuracy of the inferencing, it is desirable that the current distributions 902-908 of FIG. 9 be narrow.

As discussed above, one set of embodiments of the non-volatile storage apparats described herein performs in-memory vector-matrix multiplication (see e.g., FIG. 6) using weights stored in the memory cells. In some embodiments, the weights are represented by current flowing through the memory cells. One of the features of some embodiments of in-memory vector-matrix multiplication is the multi-block concurrent sensing, which allows for the performance of multiplication and addition inside the non-volatile memory structure 202. However, such in-memory vector-matrix multiplication also introduces an issue for sensing. For example, due to IR drops along bit lines, currents sensed through memory cells at different physical locations may appear to be different current levels even though the memory cells store the same weights. This issue is described by FIG. 11.

Figure 11:
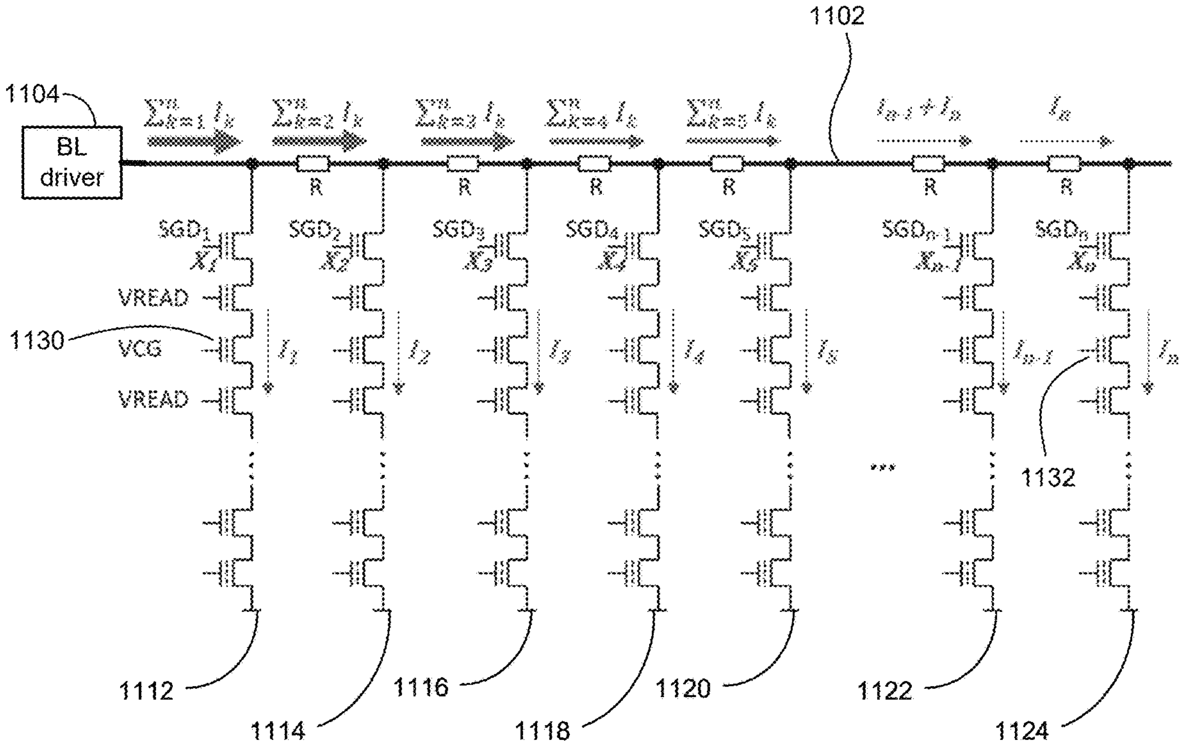
FIG. 11 depicts NAND strings in different blocks.

FIG. 11 depicts multiple NAND strings 1112, 1114, 1116, 1118, 1120, 1122 and 1124 connected to bit line 1102. In one embodiment, NAND strings 1112, 1114, 1116, 1118, 1120, 1122 and 1124 are positioned in different blocks. Bit line 102 is connected to bit line driver 1104. A bit line driver can include a voltage source, charge pump, sense amplifier, operational amplifier, etc. or other component used to control and/or source the signal on the bit line. NAND string 1112 is positioned in a block closest to bit line driver 1104. NAND string 1114 is positioned in a block further from bit line driver 1104 than NAND string 1112 but closer to bit line driver than NAND string 1116. NAND string 1116 is positioned in a block further from bit line driver 1104 than NAND string 1114 but closer to bit line driver than NAND string 1118. NAND string 1118 is positioned in a block further from bit line driver 1104 than NAND string 1116 but closer to bit line driver than NAND string 1120. NAND string 1120 is positioned in a block further from bit line driver 1104 than NAND string 1118 but closer to bit line driver than NAND string 1122. NAND string 1122 is positioned in a block further from bit line driver 1104 than NAND string 1120 but closer to bit line driver than NAND string 1124. NAND string 1124 is positioned in a block further from bit line driver 1104 than NAND string 1122. FIG. 11 also shows the input vector ($X_1$, $X_2$, $X_3$, $X_4$, $X_5$, . . . $X_{n-1}$, $X_n$) being applied to the select lines ($SGD_1$, $SGD_2$, $SGD_3$, $SGD_4$, $SGD_5$, . . . . $SGD_{n-1}$, $SGD_n$). The read reference voltage Veg is applied to the selected memory cells (the memory cells of each depicted NAND string selected to be sensed) via the selected word lines and Vread is applied to unselected memory cells via unselected word lines. FIG. 11 also depicts the current through the selected memory cells, including $I_1$ representing the current through the selected memory cell of NAND string 1112, $I_2$ representing the current through the selected memory cell of NAND string 1114, $I_3$ representing the current through the selected memory cell of NAND string 1116, $I_4$ representing the current through the selected memory cell of NAND string 1118, $I_5$ representing the current through the selected memory cell of NAND string 1120, $I_{n-1}$ representing the current through the selected memory cell of NAND string 1122, and $I_n$ representing the current through the selected memory cell of NAND string 1124.

During the multi-block concurrent sensing, memory cells storing the same weights should ideally be sensed to have the same memory cell current. For example, if memory cell 1130 on NAND string 1112 and memory cell 1132 on NAND string 1124 were both storing the same weight, then (ideally) $I_1=I_n$. However, due to IR drops along bit line 1102, the currents at different physical locations may sensed to be different current levels even though the memory cells are storing the same weights. For example, even if memory cell 1130 on NAND string 1112 and memory cell 1132 on NAND string 1124 were both storing the same weight (and have the same threshold voltage), due to IR drops along the bit line 1102 it is found that $I_1 \neq I_n$.

FIG. 11 shows the R as the bit line resistance per segment of bit line 1102. FIG. 11 also shows the current at each segment of bit line 1102. The IR drop experienced at $SGD_n$ is expressed as:

$$\left(\sum_{k=1}^{n} I_k + \sum_{k=2}^{n} I_k + \sum_{k=3}^{n} I_k + \sum_{k=4}^{n} I_k + \sum_{k=5}^{n} I_k \ldots + \sum_{k=n-1}^{n} I_k + \sum_{k=n}^{n} I_k\right) * R$$

From FIG. 11 it can be seen that memory cells further from bit line driver 1104 experience a higher IR drop than memory cells closer to bit line driver 1104. In other words, memory cells or NAND strings in blocks further from bit line driver 1104 experience a higher IR drop than memory cells or NAND strings in blocks closer to bit line driver 1104.

To compensate for the IR drop along the bit line, it is proposed that, during a sensing operation that includes concurrently sensing total output current from a bit line while the bit line is concurrently receiving output current from multiple non-volatile memory cells that are at different physical locations (e.g., different distances from a bit line driver), different voltages are applied to different memory cells based on how far a respective memory cell is from the bit line driver.

In one embodiment, it is proposed that a non-volatile memory be divided into multiple zones of non-volatile memory cells (e.g., multiple zones of blocks of non-volatile memory cells). During a sensing operation that includes concurrently sensing total output current from a bit line while the bit line is concurrently receiving output current from multiple non-volatile memory cells that are in different zones (including different regions of different blocks of different zones), different voltages are applied to selected word lines in different zones based on how far a respective zone is from the bit line driver.

Figure 12:
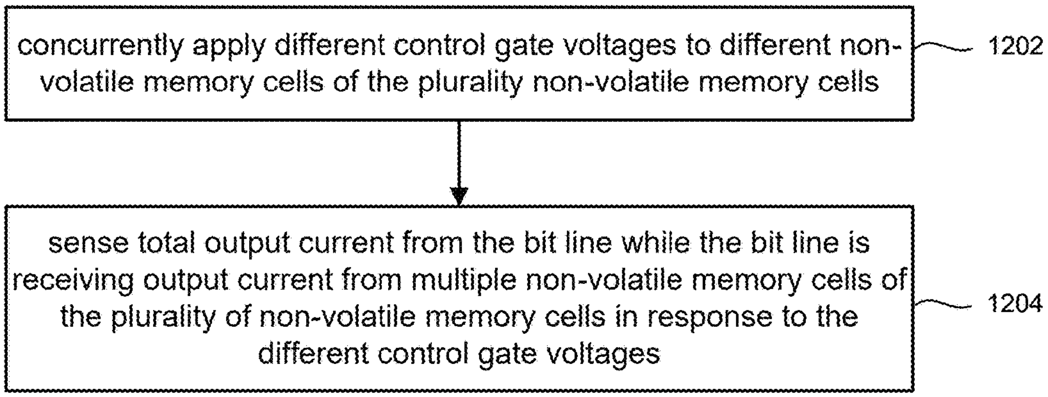
FIG. 12 is a flow chart describing one embodiment of a process for operating non-volatile memory.

FIG. 12 is a flow chart describing one embodiment of a process for operating non-volatile memory that includes applying different voltages to different memory cells to address the above-described issue related to IR drops along the bit line. In one embodiment, the process of FIG. 12 is performed during step 524 of FIG. 5B. In some example implementations, the process of FIG. 12 can be performed by any one of the one or more control circuits discussed above. The process of FIG. 12 can be performed entirely by a control circuit on memory die 200 (see FIG. 2A) or entirely by a control circuit on integrated memory assembly 207 (see FIG. 2B), rather than by memory controller 120. In one example, the process of FIG. 12 is performed by or at the direction of state machine 262, using other components of System Control Logic 260, Column Control Circuitry 210 and Row Control Circuitry 220. In another embodiment, the process of FIG. 12 is performed by memory controller 120 in combination with System Control Logic 260, Column Control Circuitry 210 and Row Control Circuitry 220. In some embodiments, the process of FIG. 12 is performed on any of the non-volatile memories discussed above.

In step 1202 of FIG. 12, the control circuit concurrently applies different control gate voltages to different non-volatile memory cells of the plurality non-volatile memory cells. For example, different voltages are applied to different selected word lines in different zones based on how far a respective zone is from the bit line driver. In step 1204, the control circuit senses total output current from the bit line while the bit line is receiving output current from multiple non-volatile memory cells of the plurality of non-volatile memory cells in response to the different control gate voltages. For example, the control circuit senses total output current from the bit line while the bit line is concurrently receiving output current from multiple non-volatile memory cells where the multiple non-volatile memory cells are positioned in different regions of different blocks of different zones.

In one set of embodiments that are implementing the process of FIG. 12, the control circuit is configured to concurrently apply different control gate voltages and sense total output current as part of an in-memory vector-matrix multiplication process. That is steps 1202 and 1204 are performed as part of the in-memory vector-matrix multiplication process described above with respect to FIGS. 6-10 such that the vector-matrix multiplication process includes the applying the different control gate voltages of step 1202, applying an input vector to the select lines (see e.g., $x_1$-$x_{20}$ of FIG. 6), and the sensing the total output current of step 1204.

In some embodiments, the non-volatile memory cells are positioned on NAND strings and the NAND strings include select gates connected to the select lines (e.g., SGD0 and SGD1). Each of the NAND strings is connected to the bit line. The plurality of non-volatile memory cells is configured to store weight information and is divided into multiple zones such that each zone includes one or more of the NAND strings and different NAND strings are in different zones. The control circuit is configured to perform vector-matrix multiplication using the weight information stored in the non-volatile memory cells by applying an input vector to the select lines (see e.g., $x_1$-$x_{20}$ of FIG. 6) and sensing output current from the bit line while the bit line is concurrently receiving current from multiple NAND strings in multiple zones (and/or in multiple regions of multiple blocks of multiple zones).

Figures 13, 14, 15:
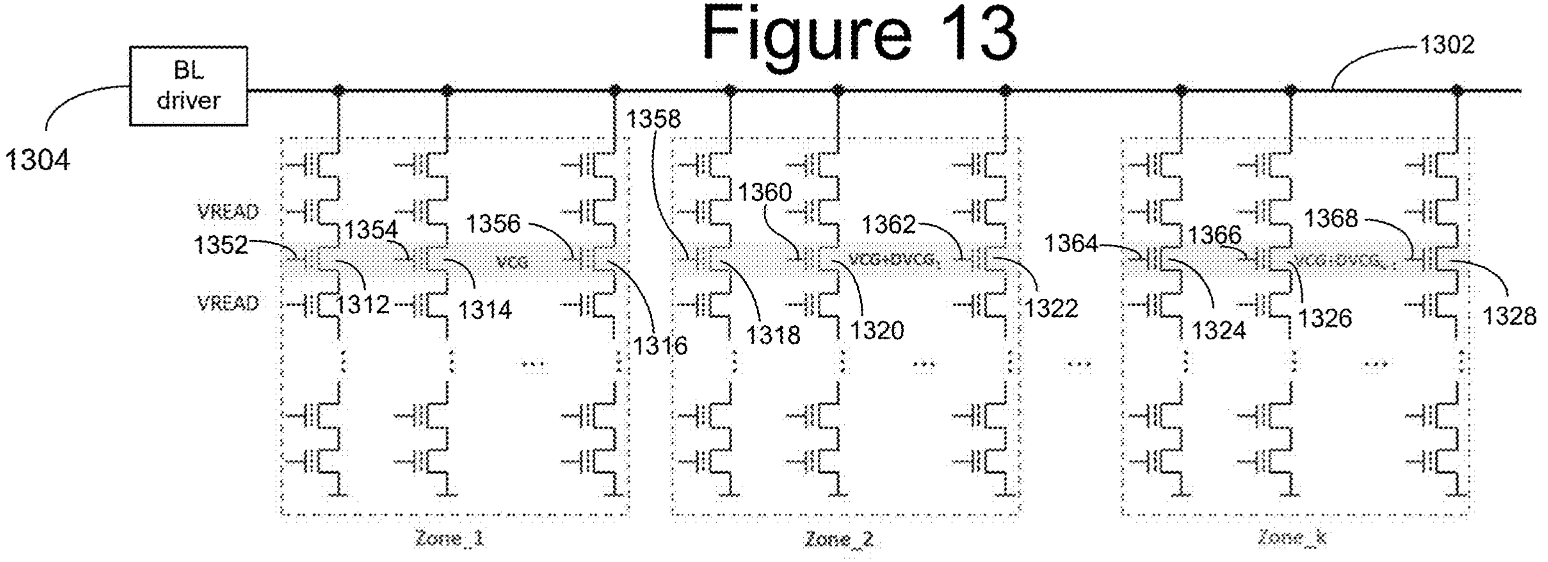
FIG. 13 depicts multiple NAND strings in different zones.
FIG. 14 is a table describing one example of different control gate voltages (or word line voltages) applied to different memory cells (or different word line or different NAND strings) in different zones.
FIG. 15 is a table describing one example of different control gate voltages (or word line voltages) applied to different memory cells (or different word line or different NAND strings) in different zones.

FIG. 13 depicts multiple NAND strings (and, therefore, multiple non-volatile memory cells) in different zones all connected to bit line 1302. For example, FIG. 13 depicts the k zones: Zone_1, Zone_2, . . . Zone_k. In one embodiment, each zone includes multiple NAND strings (and, therefore, multiple non-volatile memory cells). In one embodiment, each zone includes multiple NAND strings in multiple regions of multiple blocks. For example, purposes, FIG. 13 depicts a situation where non-volatile memory cells 1312, 1314, 1316, 1318, 1320, 1322, 1324, 1326 and 1328 (all of which are on different NAND strings) are being read/sensed concurrently. Non-volatile memory cells 1312, 1314 and 1316 are in Zone_1. Non-volatile memory cells 1318, 1320 and 1322 are in Zone_2. Non-volatile memory cells 1324, 1326 and 1328 are in Zone_k. At one end of bit line 1302 is a bit line driver 1302. As can be seen from FIG. 13, Zone_1 is closer to the bit line driver 1304 than Zone_2 and Zone_k, Zone_2 is closer to the bit line driver 1304 than Zone_k, and Zone_k is farthest from the bit line driver 1304 (i.e., Zone_1, Zone_2, . . . Zone k are at different distances from the bit line driver 1304). During step 1202 of FIG. 12, different control gate voltages are applied to different non-volatile memory cells of the plurality non-volatile memory cells based on how far a memory cell's zone is from the bit line driver 1304. For example, a first control gate voltage Veg is applied to control gates 1352, 1354 and 1356 of non-volatile memory cells 1312, 1314 and 1316 (respectively); a second control gate voltage $Vcg+DVCG_1$ is applied to control gates 1358, 1360 and 1362 of non-volatile memory cells 1318, 1320 and 1322 (respectively); and a third control gate voltage $Vcg+DVCG_{k-1}$ is applied to control gates 1364, 1366 and 1368 of non-volatile memory cells 1324, 1326 and 1328 (respectively). In one embodiment, $DVCG_1$ and $DVCG_{k-1}$ are positive offsets such that $Vcg<Vcg+DVCG_1<Vcg+DVCG_{k-1}$. In this manner, the voltage applied to control gates in a zone is based on how far that zone is from bit line driver 1304. In step 1204 of FIG. 12, total output current is sensed from the multiple non-volatile memory cells; for example, the current on bit line 1302 is sensed (e.g., by a sense amplifier) while bit line 1302 is concurrently receiving output current from non-volatile memory cells 1312, 1314 and 1316 in Zone_1 in response to Vcg, non-volatile memory cells 1318, 1320 and 1322 are in Zone_2 in response to $Vcg+DVCG_1$, . . . and non-volatile memory cells 1324, 1326 and 1328 are in Zone_k in response to $Vcg+DVCG_{k-1}$.

In one embodiment, each of the control gates 1352-1368 are connected to different word lines such that the control circuit is configured to concurrently apply different control gate voltages to different non-volatile memory cells of the plurality non-volatile memory cells via the word lines (word lines in each zone receive different control gate voltages than word lines in other zones) based on distance to bit line driver 1304. In some embodiments, multiple control gates in a same zone can be connected to a common word line.

In one set of embodiments (see e.g., FIG. 4A), the non-volatile memory cells are grouped into n blocks and the blocks are divided into k zones, with the control circuit concurrently applying different control gate voltages (word line voltages) to different zones of the multiple zones based on distance of a respective zone from the bit line driver. This is described by the table of FIG. 14, which shows each zone comprising multiple blocks. For example, Zone_1 comprises blocks 1 to $j_1$, and during step 1202 the control circuit applies Vcg to control gates (or word lines) of memory cells in Zone_1 selected for reading/sensing; Zone_2 comprises blocks $(j_1+1)$ to $j_2$, and during step 1202 the control circuit applies $Vcg+DVCG_1$ to control gates (or word lines) of memory cells in Zone_2 selected for reading/sensing; Zone_3 comprises blocks $(j_2+1)$ to $j_3$, and during step 1202 the control circuit applies $Vcg+DVCG_2$ to control gates (or word lines) of memory cells in Zone_3 selected for reading/sensing; Zone_4 comprises blocks $(j_3+1)$ to $j_4$, and during step 1202 the control circuit applies $Vcg+DVCG_3$ to control gates (or word lines) of memory cells in Zone_4 selected for reading/sensing; Zone_5 comprises blocks $(j_4+1)$ to $j_5$, and during step 1202 the control circuit applies $Vcg+DVCG_4$ to control gates (or word lines) of memory cells in Zone_5 selected for reading/sensing; . . . . Zone_k comprises blocks $(j_{k-1}+1)$ to $j_k$ and during step 1202 the control circuit applies $Vcg+DVCG_{k-1}$ to control gates (or word lines) of memory cells in Zone_k selected for reading/sensing. $DVCG_1$, $DVCG_2$, $DVCG_3$, . . . $DVCG_{k-1}$ are offsets to compensate Vcg in each zone based on distance to the bit line driver (or another factor), and are parameters of the memory that can be tuned at time of manufacturing or in the field (during end user operation).

FIG. 15 depicts a table that is similar to FIG. 14, with k=10 and (assumes) one thousand blocks. The number of zones used is an implementation decision, and can vary. For example, the number of zones can depend on a balance between compensation benefit and design cost. The more zones, the more accurate is the compensation but the higher the cost of the design. If cost was not an issue, then in one embodiment each block can be its own zone. In one embodiment Vcg=5, $DVCG_1$=0.1 v, $DVCG_2$=0.2 v, $DVCG_3$=0.3 v, . . . $DVCG_9$=0.9 v. In one embodiment, $DVCG_1$ is calculated from dividing one volt by the number of zones and each subsequent offset is a multiple of $DVCG_1$ (e.g., $DVCG_2=2*DVCG_1$, $DVCG_3=3*DVCG_1$, $DVCG_4=4*DVCG_1$, . . . ). The use of these offsets for the control gate (word line) voltages results in memory cells at a same threshold voltage in different zones will conduct the same current (i.e. drain current or cell current).

Figure 16:
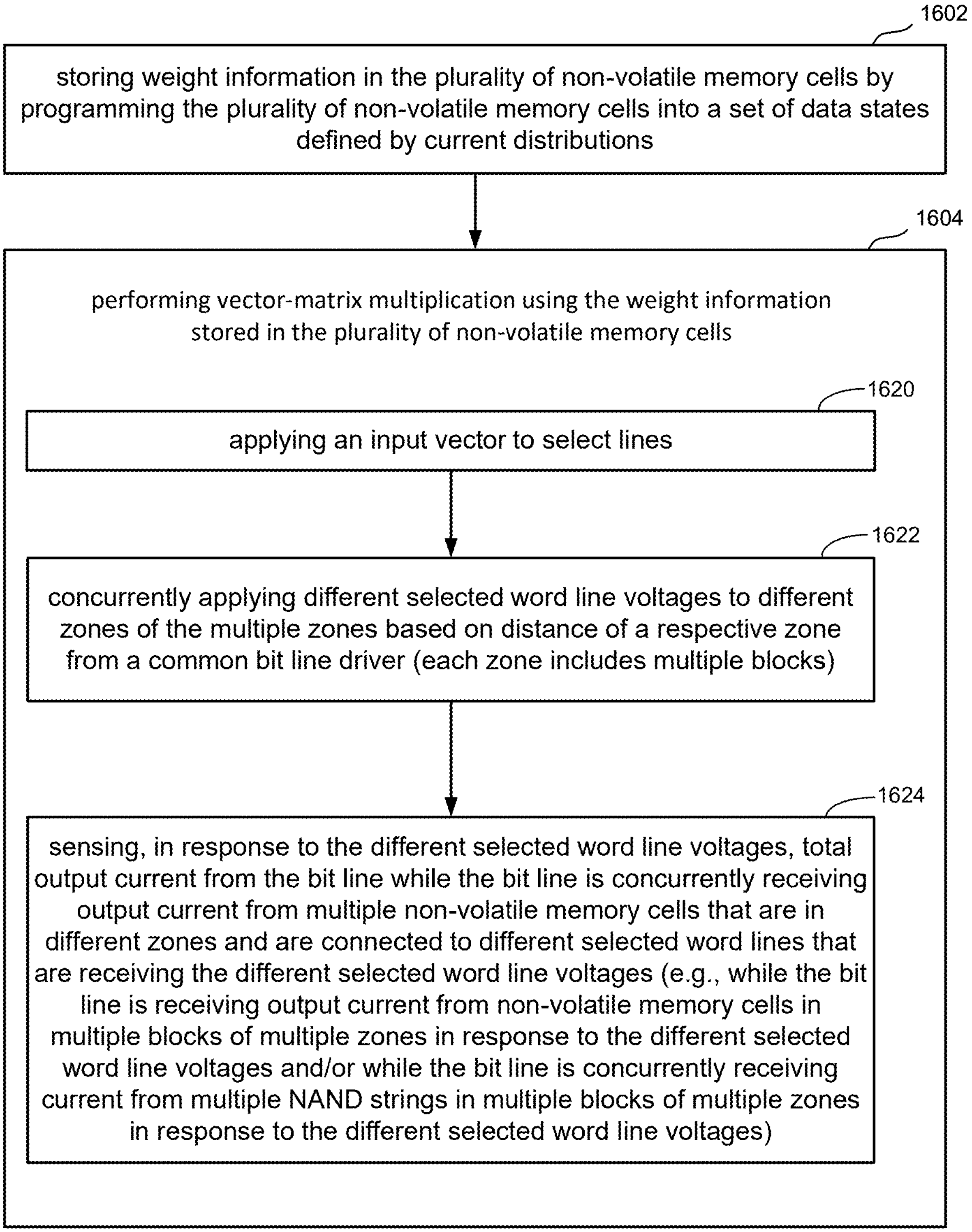
FIG. 16 is a flow chart describing one embodiment of a process for operating non-volatile memory.

FIG. 16 is a flow chart describing one embodiment of a process for operating non-volatile memory that includes applying different voltages to different memory cells to address the above-described issue related to IR drops along the bit line. In one embodiment, the process of FIG. 16 is performed during step 524 of FIG. 5B. The process of FIG. 16 is an example implementation of the process of FIG. 12. In some example implementations, the process of FIG. 16 can be performed by any one of the one or more control circuits discussed above. The process of FIG. 16 can be performed entirely by a control circuit on memory die 200 (see FIG. 2A) or entirely by a control circuit on integrated memory assembly 207 (see FIG. 2B), rather than by memory controller 120. In one example, the process of FIG. 16 is performed by or at the direction of state machine 262, using other components of System Control Logic 260, Column Control Circuitry 210 and Row Control Circuitry 220. In another embodiment, the process of FIG. 16 is performed by memory controller 120 in combination with System Control Logic 260, Column Control Circuitry 210 and Row Control Circuitry 220. In some embodiments, the process of FIG. 16 is performed on any of the non-volatile memories discussed above.

In step 1602, the control circuit stores weight information in a plurality of non-volatile memory cells by programming the plurality of non-volatile memory cells into a set of data states defined by current distributions. For example, the process of FIG. 10 is performed (as part of step 512 of FIG. 5A) to result in non-volatile memory cells being within the current distributions of FIG. 9. In step 1604, the control circuit performs vector-matrix multiplication using the weight information stored in the plurality of non-volatile memory cells (e.g., as described above with respect to FIGS. 6-8). In one embodiment, step 1604 comprises: applying an input vector to select lines (see e.g., $x_1$-$x_{20}$ of FIG. 6) in sub-step 1620; concurrently applying different selected word line voltages (e.g., Vcg, $Vcg+DVCG_1$, $Vcg+DVCG_2$, $Vcg+DVCG_3$, . . . ) to different zones of the multiple zones (e.g., Zone_1, Zone_2, . . . . Zone_k) based on distance of a respective zone from a common bit line driver (each zone includes multiple blocks) in sub-step 1620; and sensing, in response to the different selected word line voltages, total output current from the bit line while the bit line is concurrently receiving output current from multiple non-volatile memory cells that are in different zones and are connected to different selected word lines that are receiving the different selected word line voltages (e.g., while the bit line is receiving output current from non-volatile memory cells in multiple blocks of multiple zones in response to the different selected word line voltages (e.g., voltages applied to word lines connected to control gates of memory cells selected to be read/sensed, and/or while the bit line is concurrently receiving current from multiple NAND strings in multiple blocks of multiple zones in response to the different selected word line voltages).

Figure 17:
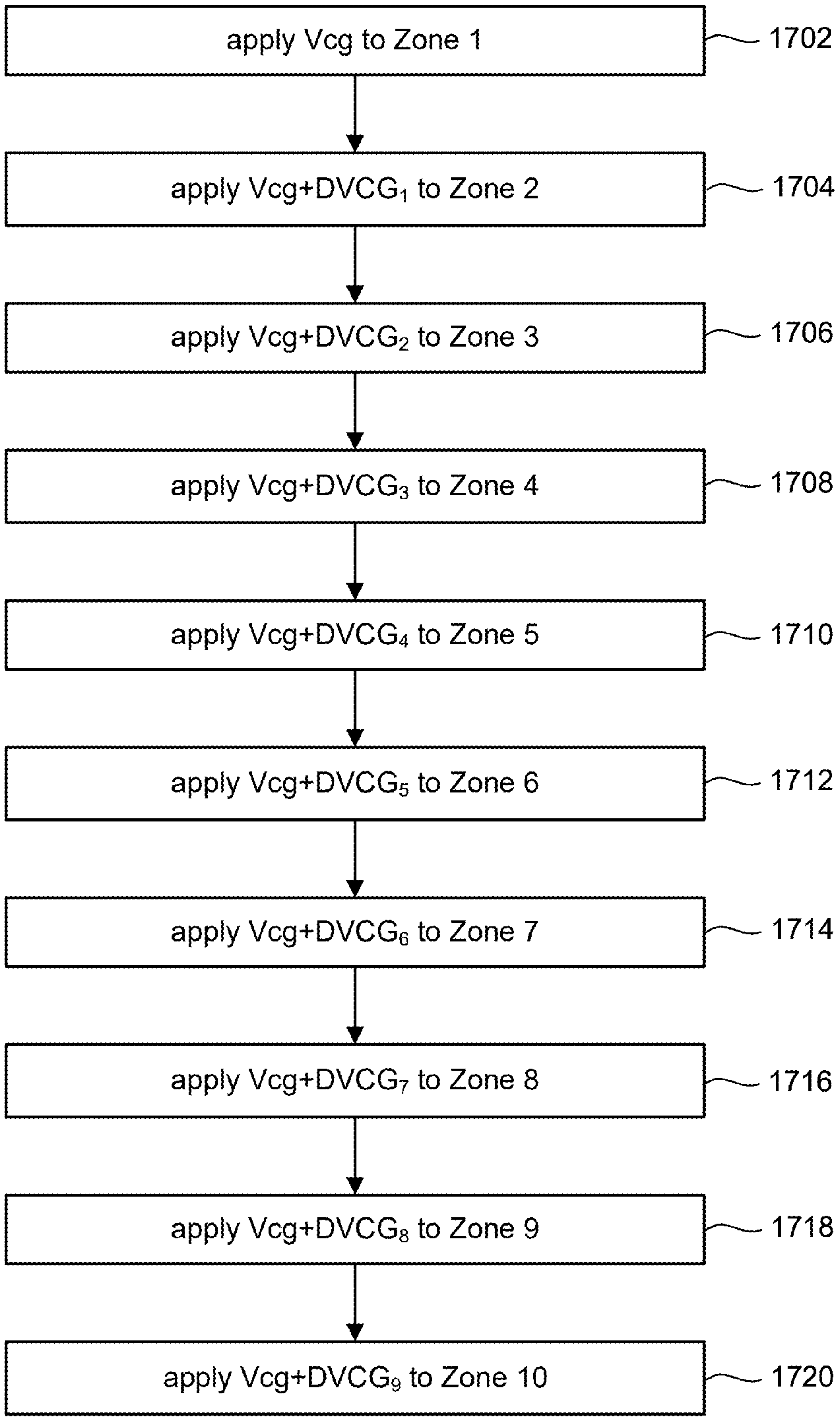
FIG. 17 is a flow chart describing one embodiment of a process for applying different control gate voltages to different memory cells (or different word line or different NAND strings) in different zones.

FIG. 17 is a flow chart describing one embodiment of a process for concurrently applying different selected word line voltages to different zones of the multiple zones based on distance of a respective zone from a common bit line driver. That is, the process of FIG. 17 is an example implementation of step 1622 of FIG. 16 (or step 1202 of FIG. 12). In step 1702, the control circuit applies Veg to the selected word lines (and, therefore, to the control gates of selected memory cells) of Zone_1. In step 1704, the control circuit applies $Vcg+DVCG_1$ to the selected word lines (and, therefore, to the control gates of selected memory cells) of Zone_2. In step 1706, the control circuit applies $Vcg+DVCG_2$ to the selected word lines (and, therefore, to the control gates of selected memory cells) of Zone_3. In step 1708, the control circuit applies $Vcg+DVCG_3$ to the selected word lines (and, therefore, to the control gates of selected memory cells) of Zone_4. In step 1710, the control circuit applies $Vcg+DVCG_4$ to the selected word lines (and, therefore, to the control gates of selected memory cells) of Zone_5. In step 1712, the control circuit applies $Vcg+DVCG_5$ to the selected word lines (and, therefore, to the control gates of selected memory cells) of Zone_6. In step 1714, the control circuit applies $Vcg+DVCG_6$ to the selected word lines (and, therefore, to the control gates of selected memory cells) of Zone_7. In step 1716, the control circuit applies $Vcg+DVCG_7$ to the selected word lines (and, therefore, to the control gates of selected memory cells) of Zone_8. In step 1718, the control circuit applies $Vcg+DVCG_8$ to the selected word lines (and, therefore, to the control gates of selected memory cells) of Zone_9. In step 1720, the control circuit applies $Vcg+DVCG_9$ to the selected word lines (and, therefore, to the control gates of selected memory cells) of Zone_10. In one embodiment, steps 1702-1720 are performed concurrently.

Figure 18:
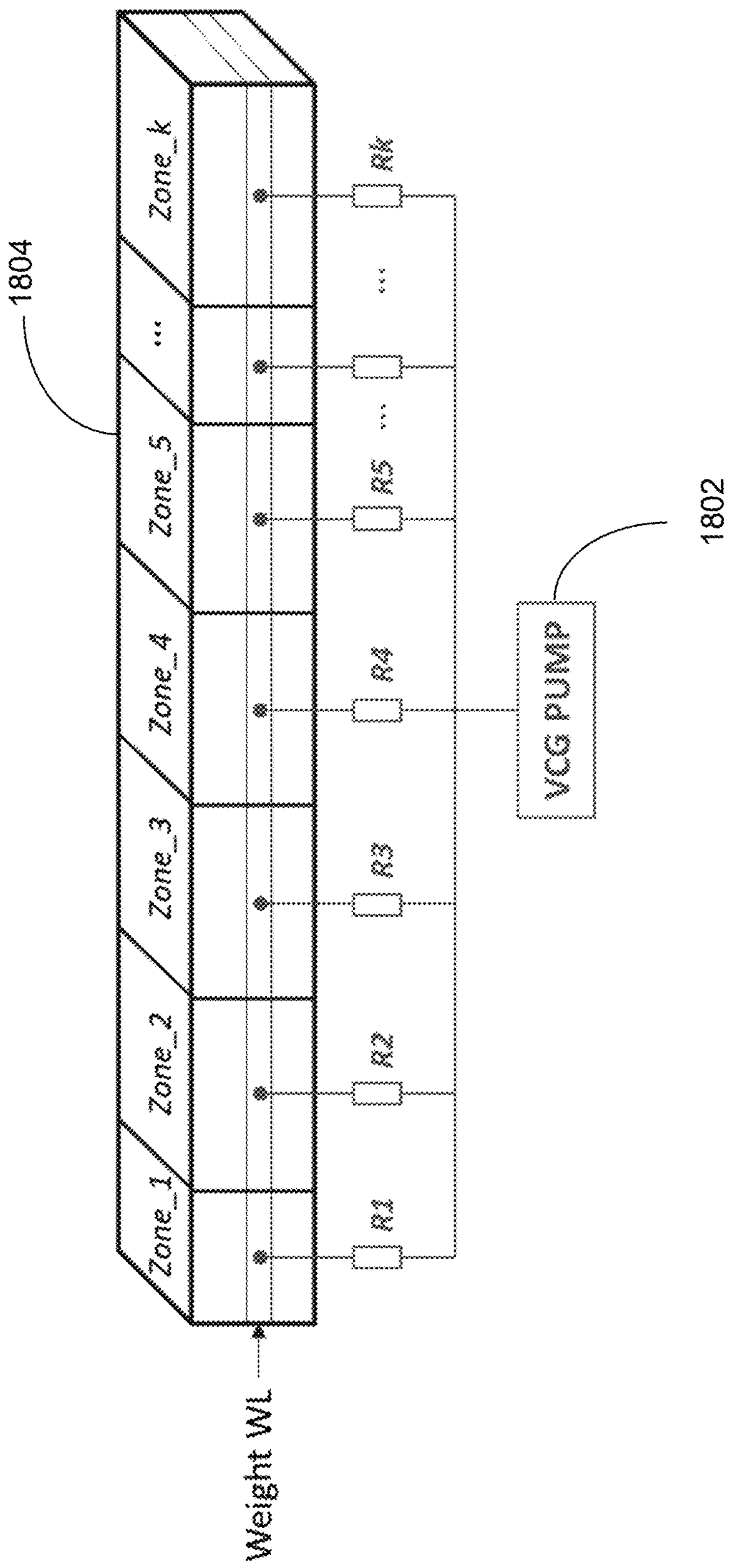
FIG. 18 is a block diagram depicting multiple zones of non-volatile memory cells receiving different control gate voltages (or different word line voltages).

FIG. 18 is a block diagram depicting multiple zones of non-volatile memory cells receiving different control gate voltages (or different word line voltages). Each zone depicted in FIG. 18 includes multiple word lines (including one or more selected word lines) connected to control gates of the plurality of non-volatile memory cells and the control circuit. FIG. 18 shows VCG Pump 1802, which is a charge pump (or other type of voltage source) that outputs a voltage larger than Veg and larger than $Vcg+DVCG_{k-1}$. Each of the zones (e.g., Zone_1 through of Zone_k) is connected to a resistor (or other resistive element) that is also connected to VCG Pump 1802. For example, resistor R1 is connected to VCG Pump 1802 and the selected word line(s) (and, therefore, the control gates of selected memory cells) of Zone_1, resistor R2 is connected to VCG Pump 1802 and the selected word line(s) (and, therefore, the control gates of selected memory cells) of Zone_2, resistor R3 is connected to VCG Pump 1802 and the selected word line(s) (and, therefore, the control gates of selected memory cells) of Zone_3, resistor R4 is connected to VCG Pump 1802 and the selected word line(s) (and, therefore, the control gates of selected memory cells) of Zone_4, resistor R5 is connected to VCG Pump 1802 and the selected word line(s) (and, therefore, the control gates of selected memory cells) of Zone_5, and resistor Rk is connected to VCG Pump 1802 and the selected word line(s) (and, therefore, the control gates of selected memory cells) of Zone_k. The different resistors R1-Rk cause the voltage applied to the memory cells in different zones to be divided differently. For example, R1 causes the selected word line(s) (and, therefore, the control gates of selected memory cells) of Zone_1 to receive Veg, R2 causes the selected word line(s) (and, therefore, the control gates of selected memory cells) of Zone_2 to receive $Vcg+DVCG_1$, R3 causes the selected word line(s) (and, therefore, the control gates of selected memory cells) of Zone_3 to receive $Vcg+DVCG_2$, R4 causes the selected word line(s) (and, therefore, the control gates of selected memory cells) of Zone_4 to receive $Vcg+DVCG_3$, R5 causes the selected word line(s) (and, therefore, the control gates of selected memory cells) of Zone_5 to receive $Vcg+DVCG_4$, and Rk causes the selected word line(s) (and, therefore, the control gates of selected memory cells) of Zone_k to receive $Vcg+DVCG_{k-1}$. In one embodiment, the resistance values of R1-Rk are different from each other in order to provide a different percentage of the voltage output of VCG Pump 1802 to a respective zone (e.g., subset of the non-volatile memory cells) as the different control gate (selected word line) voltages.

A non-volatile memory has been proposed that increases reliability by, during a sensing operation that includes concurrently sensing total output current from a bit line while the bit line is concurrently receiving output current from multiple non-volatile memory cells that are in different zones, applying different voltages to selected word lines in different zones based on how far a respective zone is from the bit line driver.

One embodiment includes a non-volatile storage apparatus comprising a bit line; a plurality of non-volatile memory cells connected to the bit line; and a control circuit connected to the plurality of non-volatile memory cells and the bit line. The control circuit is configured to concurrently apply different control gate voltages to different non-volatile memory cells of the plurality non-volatile memory cells and sense total output current from the bit line while the bit line is receiving output current from multiple non-volatile memory cells of the plurality of non-volatile memory cells in response to the different control gate voltages.

One example implementation further comprises a bit line driver. The control circuit is configured to concurrently apply different control gate voltages to different non-volatile memory cells of the plurality non-volatile memory cells based on distance of a respective non-volatile memory cell from the bit line driver.

In one example implementation, the plurality of non-volatile memory cells are divided into multiple zones; the control circuit is configured to concurrently apply different control gate voltages to different non-volatile memory cells by concurrently applying different control gate voltages to different zones of the multiple zones; and the control circuit is configured to sense total output current from the bit line by sensing total output current from the bit line while the bit line is receiving output current from non-volatile memory cells in different zones in response to the different control gate voltages.

In one example implementation, the plurality of non-volatile memory cells are organized into blocks, each zone includes multiple blocks; and the control circuit is configured to sense total output current from the bit line by sensing total output current from the bit line while the bit line is receiving output current from non-volatile memory cells in multiple blocks of multiple zones in response to the different control gate voltages.

One example implementation further comprises a bit line driver. The plurality of non-volatile memory cells are divided into multiple zones, the control circuit is configured to concurrently apply different control gate voltages to different non-volatile memory cells by concurrently applying different control gate voltages to different zones of the multiple zones based on distance of a respective zone from the bit line driver, the control circuit is configured to sense total output current from the bit line by sensing total output current from the bit line while the bit line is receiving output current from non-volatile memory cells in different zones in response to the different control gate voltages.

In one example implementation, the control circuit is configured to concurrently apply different control gate voltages to different zones of the multiple zones by: applying a base control gate voltage to a first zone closest to the bit line driver; applying the base control gate voltage plus a first offset to a second zone farther from the bit line driver than the first zone; and applying the base control gate voltage plus a second offset to a third zone farther from the bit line driver than the second zone.

In one example implementation, the control circuit is configured to concurrently apply different control gate voltages to different zones of the multiple zones by: applying a base control gate voltage to a first zone closest to the bit line driver; and applying the base control gate voltage plus customized offsets to other zones farther from the bit line driver than the first zone, the customized offsets are based on distance of a respective zone from the bit line driver.

In one example implementation, the plurality of non-volatile memory cells are organized into blocks, each zone includes multiple blocks; and the control circuit is configured to sense total output current from the bit line by sensing total output current from the bit line while the bit line is receiving output current from non-volatile memory cells in multiple blocks of multiple zones in response to the different control gate voltages.

One example implementation further comprises multiple word lines connected to control gates of the plurality of non-volatile memory cells and the control circuit. The control circuit is configured to concurrently apply different control gate voltages to different non-volatile memory cells of the plurality non-volatile memory cells via the word lines.

In one example implementation, the plurality of non-volatile memory cells are divided into multiple zones; the control circuit is configured to concurrently apply different control gate voltages to different non-volatile memory cells by concurrently applying different control gate voltages to word lines in different zones such that word lines in each zone receive different control gate voltages than word lines in other zones; and the control circuit is configured to sense total output current from the bit line by sensing total output current from the bit line while the bit line is receiving output current from non-volatile memory cells in different zones in response to the different control gate voltages.

One example implementation further comprises a voltage source and a plurality of resistors connected to the voltage source for receiving a first voltage from the voltage source. Each resistor of the plurality of resistors is connected to a different subset of the non-volatile memory cells for providing a different percentage of the first voltage to the respective subset of the non-volatile memory cells as the different control gate voltages.

One example implementation further comprises multiple word lines connected to control gates of the plurality of non-volatile memory cells and the control circuit. The plurality of non-volatile memory cells are divided into multiple zones. The control circuit is configured to concurrently apply different control gate voltages to different non-volatile memory cells by concurrently applying different control gate voltages to word lines in different zones such that word lines in each zone receive different control gate voltages than word lines in other zones. The example implementation further comprises a voltage source and a plurality of resistors connected to the voltage source for receiving a first voltage from the voltage source. Each resistor of the plurality of resistors is connected to a different zone such that each resistor is connected to control gates of non-volatile memory cells in its respective zone for providing a different percentage of the first voltage to non-volatile memory cells of its respective zone as the different control gate voltages.

In one example implementation, the control circuit is configured to concurrently apply the different control gate voltages and sense the total output current as part of an in-memory vector-matrix multiplication process.

One example implementation further comprises select gates connected to the non-volatile memory cells and select lines connected to the select gates and the control circuit. The control circuit is configured to perform a vector-matrix multiplication process including: (i) the applying the different control gate voltages, (ii) applying an input vector to the select lines and (iii) the sensing the total output current.

One example implementation further comprises select lines connected to the control circuit. The non-volatile memory cells are positioned on NAND strings. The NAND strings include select gates connected to the select lines. Each of the NAND string is connected to the bit line. The plurality of non-volatile memory cells are configured to store weight information. The plurality of non-volatile memory cells are divided into multiple zones. Each zone includes one or more of the NAND strings such that different NAND strings are in different zones. The control circuit is configured to perform vector-matrix multiplication using the weight information stored in the non-volatile memory cells by: (i) applying an input vector to the select lines and (ii) sensing output current from the bit line while the bit line is concurrently receiving current from multiple NAND strings in multiple zones.

One embodiment includes a method of operating a non-volatile memory comprising a plurality of non-volatile memory cells connected to a bit line and multiple word lines, the plurality of non-volatile memory cells and the multiple word lines are divided into multiple zones. The method comprises concurrently applying different selected word line voltages to different zones of the multiple zones and sensing total output current from the bit line while the bit line is concurrently receiving output current from multiple non-volatile memory cells that are in different zones and are connected to different selected word lines that are receiving the different selected word line voltages.

In one example implementation, the concurrently applying different selected word line voltages to different zones of the multiple zones includes concurrently applying different selected word line voltages to different zones of the multiple zones based on distance of a respective zone from a common bit line driver, the common bit line driver is connected to the bit line.

In one example implementation, the plurality of non-volatile memory cells are organized into blocks, each zone includes multiple blocks; and the sensing total output current from the bit line includes sensing total output current from the bit line while the bit line is receiving output current from non-volatile memory cells in multiple blocks of multiple zones in response to the different selected word line voltages.

One example implementation further comprises storing weight information in the plurality of non-volatile memory cells by programming the plurality of non-volatile memory cells into a set of data states defined by current distributions. The non-volatile memory cells are positioned in NAND strings. The NAND strings include select gates connected to the select lines. Each of the NAND strings is connected to the bit line. Each zone includes one or more of the NAND strings such that different NAND strings are in different zones. The sensing total output current includes sensing total output current from the bit line while the bit line is concurrently receiving current from multiple NAND strings in multiple zones. The method further comprises performing vector-matrix multiplication using the weight information stored in the plurality of non-volatile memory cells by: (i) applying an input vector to select lines, (ii) the concurrently applying different selected word line voltages to different zones of the multiple zones and (iii) the sensing.

One embodiment includes a non-volatile storage apparatus comprising: a bit line driver; a bit line connected to the bit line driver; a non-volatile memory comprising a plurality of non-volatile memory cells connected to the bit line, the plurality of non-volatile memory cells are positioned in multiple blocks, the multiple blocks are grouped into zones, each zone includes multiple blocks; and means for performing vector matrix multiplication in the non-volatile memory by concurrently sensing total output current from the bit line while the bit line is concurrently receiving output current from multiple non-volatile memory cells of the plurality of non-volatile memory cells that are in different zones in response to different control gate voltages applied to the memory cells that are in different zones based on how far a respective zone is from the bit line driver. For purposes of this document, the means for performing vector matrix multiplication by concurrently sensing total output current from the bit line while the bit line is concurrently receiving output current from multiple non-volatile memory cells of the plurality of non-volatile memory cells that are in different zones in response to different control gate voltages applied to the memory cells that are in different zones based on how far a respective zone is from the bit line driver can be implemented by any of the embodiments of a control circuit described above (see also e.g., FIG. 1, 2A or 2B), including a microprocessor or microcontroller, performing vector matrix multiplication as per FIGS. 5B, 5C, 6, 7, and/or 8 in conjunction with the processes of FIGS. 12 and/or 16.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
- a bit line driver;
- a bit line connected to the bit line driver;
- a plurality of non-volatile memory cells connected to the bit line; and
- a control circuit connected to the plurality of non-volatile memory cells and the bit line, the control circuit is configured to:
  - concurrently apply different control gate voltages to different non-volatile memory cells of the plurality non-volatile memory cells based on distance from the bit line driver, and
  - sense total output current from the bit line while the bit line is concurrently receiving output current from multiple non-volatile memory cells of the plurality of non-volatile memory cells in response to the different control gate voltages.

2. The non-volatile storage apparatus of claim 1, wherein:
- the plurality of non-volatile memory cells are divided into multiple zones;
- the control circuit is configured to concurrently apply different control gate voltages to different non-volatile memory cells by concurrently applying different control gate voltages to different zones of the multiple zones; and
- the control circuit is configured to sense total output current from the bit line by sensing total output current from the bit line while the bit line is receiving output current from non-volatile memory cells in different zones in response to the different control gate voltages.

3. The non-volatile storage apparatus of claim 2, wherein:
- the plurality of non-volatile memory cells are organized into blocks, each zone includes multiple blocks; and the control circuit is configured to sense total output current from the bit line by sensing total output current from the bit line while the bit line is receiving output current from non-volatile memory cells in multiple blocks of multiple zones in response to the different control gate voltages.

4. The non-volatile storage apparatus of claim 2, wherein the control circuit is configured to concurrently apply different control gate voltages to different zones of the multiple zones by:

applying a base control gate voltage to a first zone closest to the bit line driver;

applying the base control gate voltage plus a first offset to a second zone farther from the bit line driver than the first zone; and applying the base control gate voltage plus a second offset to a third zone farther from the bit line driver than the second zone.

5. The non-volatile storage apparatus of claim 2, wherein the control circuit is configured to concurrently apply different control gate voltages to different zones of the multiple zones by:

applying a base control gate voltage to a first zone closest to the bit line driver; and applying the base control gate voltage plus customized offsets to other zones farther from the bit line driver than the first zone, the customized offsets are based on distance of a respective zone from the bit line driver.

6. The non-volatile storage apparatus of claim 1, further comprising:

multiple word lines connected to control gates of the plurality of non-volatile memory cells and the control circuit, the control circuit is configured to concurrently apply different control gate voltages to different non-volatile memory cells of the plurality non-volatile memory cells via the word lines.

7. The non-volatile storage apparatus of claim 6, wherein:

the plurality of non-volatile memory cells are divided into multiple zones;

the control circuit is configured to concurrently apply different control gate voltages to different non-volatile memory cells by concurrently applying different control gate voltages to word lines in different zones such that word lines in each zone receive different control gate voltages than word lines in other zones; and the control circuit is configured to sense total output current from the bit line by sensing total output current from the bit line while the bit line is receiving output current from non-volatile memory cells in different zones in response to the different control gate voltages.

8. The non-volatile storage apparatus of claim 1, further comprising:

a voltage source; and a plurality of resistors connected to the voltage source for receiving a first voltage from the voltage source, each resistor of the plurality of resistors is connected to a different subset of the non-volatile memory cells for providing a different percentage of the first voltage to the respective subset of the non-volatile memory cells as the different control gate voltages.

9. The non-volatile storage apparatus of claim 1, further comprising:

multiple word lines connected to control gates of the plurality of non-volatile memory cells and the control circuit, the plurality of non-volatile memory cells are divided into multiple zones, the control circuit is configured to concurrently apply different control gate voltages to different non-volatile memory cells by concurrently applying different control gate voltages to word lines in different zones such that word lines in each zone receive different control gate voltages than word lines in other zones;

a voltage source; and a plurality of resistors connected to the voltage source for receiving a first voltage from the voltage source, each resistor of the plurality of resistors is connected to a different zone such that each resistor is connected to control gates of non-volatile memory cells in its respective zone for providing a different percentage of the first voltage to non-volatile memory cells of its respective zone as the different control gate voltages.

10. The non-volatile storage apparatus of claim 1, wherein:

the control circuit is configured to concurrently apply different control gate voltages and sense total output current as part of an in-memory vector matrix multiplication process.

11. The non-volatile storage apparatus of claim 1, further comprising:

select gates connected to the non-volatile memory cells; and select lines connected to the select gates and the control circuit, the control circuit is configured to perform a vector matrix multiplication process including: (i) the applying the different control gate voltages, (ii) applying an input vector to the select lines and (iii) the sensing the total output current.

12. The non-volatile storage apparatus of claim 1, further comprising:

select lines connected to the control circuit, the non-volatile memory cells are positioned on NAND strings, the NAND strings include select gates connected to the select lines, each of the NAND strings is connected to the bit line, the plurality of non-volatile memory cells are configured to store weight information, the plurality of non-volatile memory cells are divided into multiple zones, each zone includes one or more of the NAND strings such that different NAND strings are in different zones, the control circuit is configured to perform vector matrix multiplication using the weight information stored in the non-volatile memory cells by: (i) applying an input vector to the select lines and (ii) sensing output current from the bit line while the bit line is concurrently receiving current from multiple NAND strings in multiple zones.

13. A method of operating a non-volatile memory comprising a plurality of non-volatile memory cells connected to bit lines and word lines, the bit lines are connected to bit line drivers, the plurality of non-volatile memory cells are divided into multiple zones, the method comprising:

storing weight information in the plurality of non-volatile memory cells; and performing vector matrix multiplication using the weight information stored in the plurality of non-volatile memory cells, the performing vector matrix multiplication includes:

applying an input vector to select lines for the non-volatile memory, concurrently applying different selected word line voltages to different zones of the multiple zones based on distance between the bit line drivers and the respective zone, and sensing total output currents from the bit lines while each bit line is concurrently receiving output current from multiple non-volatile memory cells that are in different zones and are connected to different selected word lines that are receiving the different selected word line voltages, the output currents form an output vector for the vector matrix multiplication.

14. The method of claim 13, wherein:

the plurality of non-volatile memory cells are organized into blocks, each zone includes multiple blocks; and the sensing total output current from the bit lines includes sensing total output current from the bit lines while each bit line is receiving output current from non-volatile memory cells in multiple blocks of multiple zones in response to the different selected word line voltages.

15. A non-volatile storage apparatus, comprising:

a bit line driver;

a bit line connected to the bit line driver;

a non-volatile memory comprising a plurality of non-volatile memory cells arranged as NAND strings, the NAND strings are connected to the bit line, the plurality of non-volatile memory cells and the NAND strings are positioned in multiple blocks, the multiple blocks are grouped into zones, each zone includes multiple blocks; and means for performing vector matrix multiplication in the non-volatile memory by concurrently sensing total output current from the bit line while the bit line is concurrently receiving output current from multiple non-volatile memory cells of different NAND strings that are in different zones in response to different control gate voltages applied to the memory cells that are in different zones based on how far a respective zone is from the bit line driver.

* * * * *